(12) United States Patent
Varnica et al.

(10) Patent No.: US 8,312,341 B1
(45) Date of Patent: Nov. 13, 2012

(54) INTERLEAVED ERROR CORRECTION CODING FOR CHANNELS WITH NON-UNIFORM SNRS

(75) Inventors: Nedeljko Varnica, Sunnyvale, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 1377 days.

(21) Appl. No.: 11/951,062

(22) Filed: Dec. 5, 2007

(51) Int. Cl.
*G06F 11/00* (2006.01)
*G06F 11/30* (2006.01)
*G08C 25/00* (2006.01)
*H03M 13/00* (2006.01)
*H04L 1/00* (2006.01)

(52) U.S. Cl. ........................ 714/752; 714/746
(58) Field of Classification Search .................. None
See application file for complete search history.

(56) References Cited

U.S. PATENT DOCUMENTS

| | | | | |
|---|---|---|---|---|
| 5,790,550 A * | 8/1998 | Peeters et al. | ............ | 370/480 |
| 6,961,388 B2 * | 11/2005 | Ling et al. | ............ | 375/267 |
| 7,167,684 B2 * | 1/2007 | Kadous et al. | ............ | 455/67.13 |
| 7,817,740 B2 * | 10/2010 | Su et al. | ............ | 375/262 |
| 2003/0128658 A1 * | 7/2003 | Walton et al. | ............ | 370/208 |
| 2005/0216821 A1 | 9/2005 | Harada | | |
| 2006/0045213 A1 * | 3/2006 | Shen et al. | ............ | 375/340 |
| 2006/0107179 A1 * | 5/2006 | Shen et al. | ............ | 714/758 |
| 2009/0215403 A1 * | 8/2009 | Currivan et al. | ............ | 455/69 |
| 2009/0217142 A1 * | 8/2009 | Cameron et al. | ............ | 714/796 |
| 2009/0313528 A1 * | 12/2009 | Chugg et al. | ............ | 714/758 |

OTHER PUBLICATIONS

W. Chou, et al., "Interleaving and error correction in volume holographic memory systems", Applied Optics, vol. 37, No. 29 (Oct. 10, 1998), pp. 6951-6968.
H. Pishro-Nik, et al., "Nonuniform Error Correction Using Low-Density Parity-Check Codes", IEEE Transactions on Information Theory, vol. 51, No. 7 (Jul. 7, 2005), pp. 2702-2714.
A. Sanaei, et al., "LDPC Code Design for Nonuniform Power-Line Channels", EURASIP Journal on Advances in Signal Processing, vol. 2007, Article ID 76146 (2007), pp. 1-9.

* cited by examiner

*Primary Examiner* — Guerrier Merant

(57) ABSTRACT

Generation of code words for error correction coding (ECC) of a channel with a non-uniform signal-to-noise ratio (SNR) is provided. A channel SNR profile is accessed, which can also include determining the channel profile. The channel profile characterizes sections of the channel having like SNR values. Each section of the channel is partitioned into a number of partitions. The number of partitions of each section equals a number of code words for the channel. The code words are generated by interleaving the partitions from each section such that an average SNR of each code word is made substantially the same as an average SNR of the channel.

12 Claims, 22 Drawing Sheets

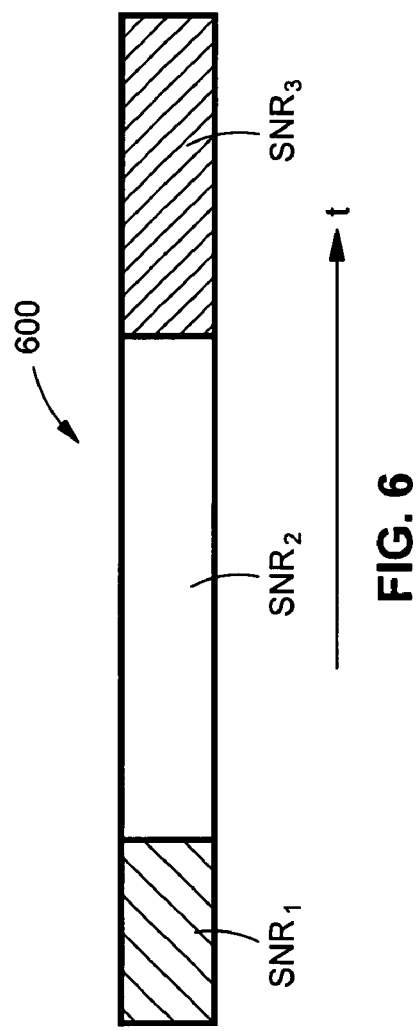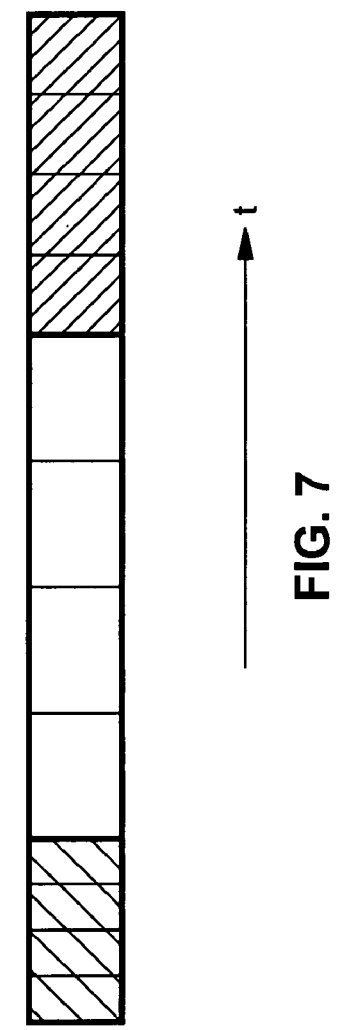

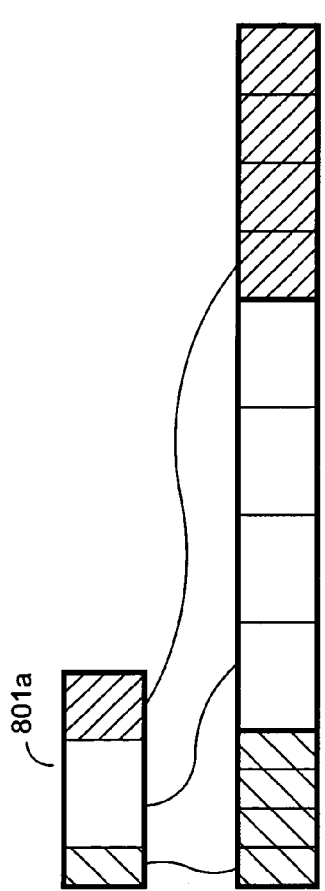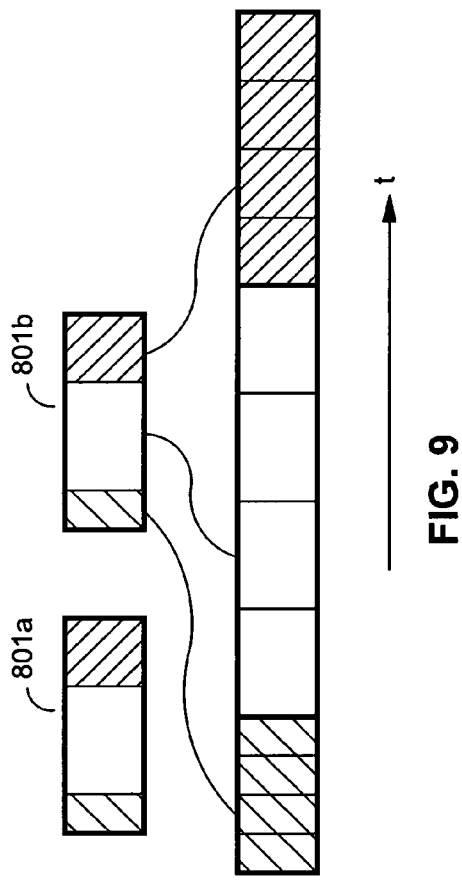

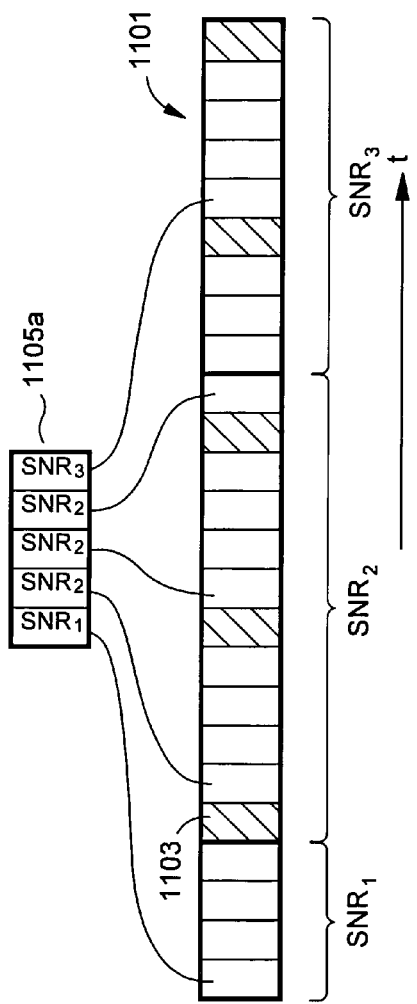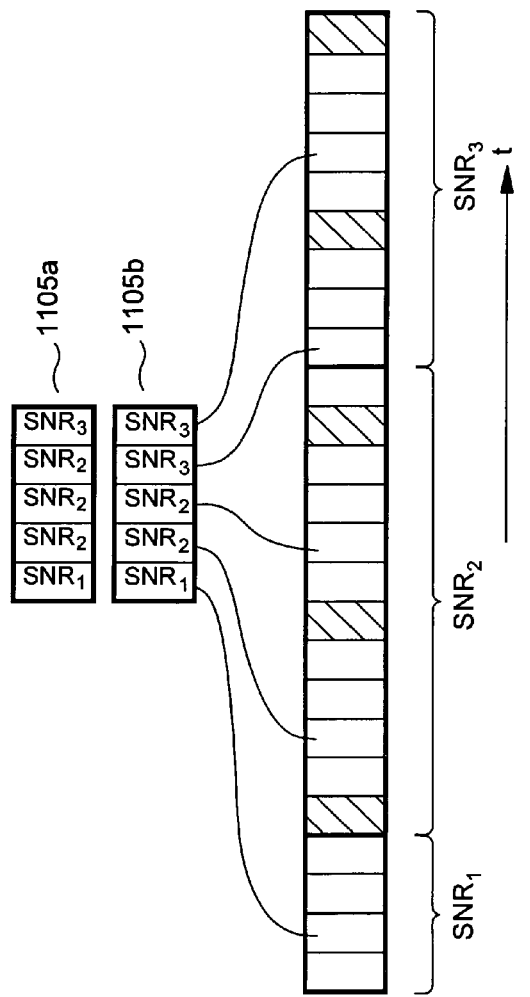
FIG. 11A
FIG. 11B

INTERLEAVED ERROR CORRECTION CODING FOR CHANNELS WITH NON-UNIFORM SNRS

BACKGROUND OF THE INVENTION

1. Field of the Invention

The present invention relates to data storage and/or transmission channels with non-uniform, or varying, signal-to-noise ratios (SNRs), and more particularly to the use of interleaved error correction coding for such channels.

2. Background of the Invention

Data transfer systems, such as data transmission systems and data storage systems, are typically characterized using the concept of data channels. In data transmission systems, for example, data can be transmitted via channels such as wires, fiber-optic cable, wireless protocols, etc. In data storage systems, the storage medium itself is a data channel. In this regard, storage system channels can include, for example, hard disk platters, solid state memory, digital tape, volume holographic memory, and others.

The efficiency and reliability of data channels can depend on many factors, such as the signal-to-noise ratio (SNR) of the channel. For example, storage mediums having a high SNR can allow for more accurate storage and recovery of data. On the other hand, storage mediums having a low SNR can result in high error rates, including misread and lost data. Similarly, the accuracy of a digital data communication channel depends on its SNR. High-SNR communication channels can transmit data quickly and accurately, while low-SNR communication channels can be plagued with errors, such as dropped messages.

Error correction coding (ECC) can provide a way to reduce errors in data storage and transmission by introducing data redundancy into the channel, typically in the form of extra bits that are used to check the validity of the original data. Examples of error correcting codes include Reed-Solomon (RS), Bose, Ray-Chaudhuri, Hocquenghem (BCH), low-density parity-check (LDPC) and Turbo codes. ECC codes typically utilize code words, which are specific patterns of bits or symbols in a storage medium or transmission signal, to group data into chunks to be checked for errors. In systematic codes, for example, some of the bits or symbols in a code word are reserved for the data that is to be stored or transmitted (the "original data"), and other bits or symbols in a code word are reserved for data used in the checking process. For non-systematic codes, "original data" is not kept (is not directly available at the output of the encodes), but can be decoded from encoded code words. In this way, code words can help improve the bit error rate (BER) of a channel, which is the ratio of incorrect bits to all bits received through the channel in a given period of time. In particular, the use of code words can reduce errors caused by low SNR of a channel.

However, the use of ECC to improve the BER of a channel results in some drawbacks, such as reduced storage capacity or transmission rate for the original data. In particular, stronger ECC codes have longer code words that are better able to detect and correct errors, thus can better improve the BER of a channel. On the other hand, longer code words also result in a greater reduction of storage capacity or transmission rate. Consequently, many ECC codes are designed to utilize code words that are just strong enough to improve the BER of a channel to a minimum acceptable level. For channels of uniform SNR, i.e., channels having a single SNR throughout the channel, it is not too difficult to design an ECC code in which all code words are just strong enough to improve the BER of the channel to a minimum acceptable level.

For channels of non-uniform SNR, which have multiple or varying SNRs throughout the channel, conventional ECC codes are designed around the "lowest common denominator" of the system, that is, the lowest SNR in the channel. Thus, while code words associated with regions of the lowest SNR are designed to be just strong enough to meet the minimum BER, code words associated with the regions of higher SNR typically include extra bits that are not needed to achieve the minimum BER.

SUMMARY OF THE INVENTION

The present invention addresses the foregoing situation through an interleaved error correction coding for channels with non-uniform SNRs.

In one example embodiment of the present invention, a channel SNR profile is accessed, which can also include determining the channel profile. The channel profile characterizes sections of the channel having like SNR values. Each section of the channel is partitioned into a number of partitions. The number of partitions of each section equals a number of code words for the channel. The code words are generated by interleaving the partitions from each section such that an average SNR of each code word is made the same or substantially the same as an average SNR of the channel.

In one example aspect of the invention, the error correction coding is an irregular code, in which code words comprise bits with different levels of protection. The bits of the irregular code are interleaved based on a code word SNR profile, which characterizes the partitions of the code word. This can include, for example, interleaving a bit having a highest level of protection to correspond to a partition of a code word with a lowest SNR value, and iteratively interleaving the remaining bits, such that a bit having a highest level of protection of the remaining bits is interleaved to correspond to a partition of the code word with a lowest SNR value of the remaining available partitions.

In another example embodiment of the present invention, a plurality of sets of code words are generated for error correction coding (ECC) of a channel with a non-uniform signal-to-noise ratio (SNR), the sets corresponding to ECC codes of different strengths. A channel SNR profile is accessed. The channel SNR profile characterizes sections of the channel having like SNR values. Each section of the channel is partitioned into partitions. The code words are generated by interleaving the partitions from each section. The partitioning is based on the relative strengths of the ECC codes such that error rates associated with the sets of code words are made the same or substantially the same.

In another embodiment of the invention, code words are generated for symbol-based error correction coding of a channel with a non-uniform signal-to-noise ratio (SNR). A symbol SNR value associated with each symbol in the channel is accessed. A plurality of the symbols are non-uniform symbols, which comprise portions of at least two sections of the channel with different SNR values. The symbol SNR value of a non-uniform symbol is based on a weighted average of the SNR values of the portions of channel sections comprising the non-uniform symbol. The symbols are grouped into sets according to symbol SNR value. Each symbol set is partitioned into partitions based on a number of code words for the channel. The code words are generated by interleaving the partitions from the symbol sets.

In one example aspect of the invention, an average SNR of each code word is made substantially the same as an average SNR of the channel.

In another example aspect of the invention, the error correction coding is an irregular code, in which code words comprise symbols with different levels of protection, and the symbols of the irregular code are interleaved based on a code word SNR profile. The code word SNR profile characterizes the sizes and symbol SNR values of the partitions of the code word. This can include, for example, interleaving a symbol having a highest level of protection to correspond to a partition of a code word with a lowest symbol SNR value, and iteratively interleaving the remaining symbols, such that a symbol having a highest level of protection of the remaining symbols is interleaved to correspond to a partition of the code word with a lowest symbol SNR value of the remaining available partitions.

The invention can be embodied in, without limitation, a method, apparatus, or computer-executable program instructions.

This brief summary has been provided so that the nature of the invention may be understood quickly. A more complete understanding of the invention can be obtained by reference to the following detailed description in connection with the attached drawings.

BRIEF DESCRIPTION OF THE DRAWINGS

FIG. 6 is a representational diagram of an example time varying channel according to one embodiment of the present invention.

FIG. 7 is a representational diagram illustrating partitioning of SNR sections of a time varying channel according to one embodiment of the present invention.

FIGS. 8 and 9 are representational diagrams illustrating interleaving of partitions of SNR sections according to one embodiment of the present invention.

FIGS. 11A and 11B are representational diagrams illustrating one example of a time varying channel in a symbol based ECC coding scenario according to one embodiment of the present invention.

DETAILED DESCRIPTION

Figure 1:
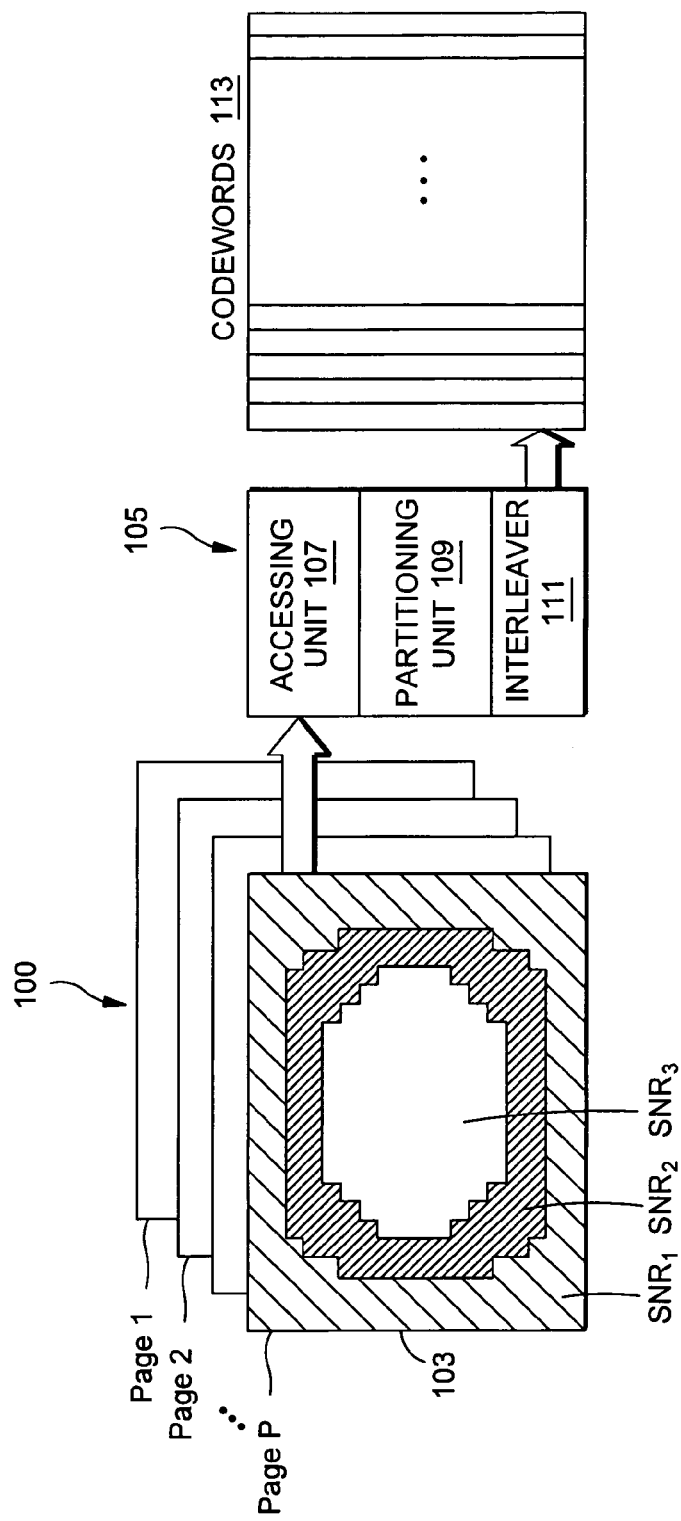
FIG. 1 is representative diagram of one example implementation of the present invention.

FIG. 1 is a representational diagram of one example embodiment of the present invention. Specifically, FIG. 1 shows a volume holographic memory (VHM) 100 represented by P pages of memory 103, each of which maps to different physical locations within the holographic storage medium. Typically, VHMs have a non-uniform signal-to-noise ratio (SNR). For example, Page P of FIG. 1 has three sections of different SNR values: $SNR_1$, $SNR_2$, and $SNR_3$.

Page memory systems such as the one shown in FIG. 1 can be implemented in applications other than VHMs, such as personal computers, hard disks, optical disks, solid state memory chips, etc. In particular, one skilled in the art will recognize in view of this description that the invention can be applied in other environments and uses than those shown and described herein.

FIG. 1 also shows a code word generator 105 that includes an accessing unit 107, a partitioning unit 109, and an interleaver 111, which perform various processes described in more detail below to generate code words 113. Code words 113 are used in error correction coding (ECC) of VHM 100.

Figure 2:
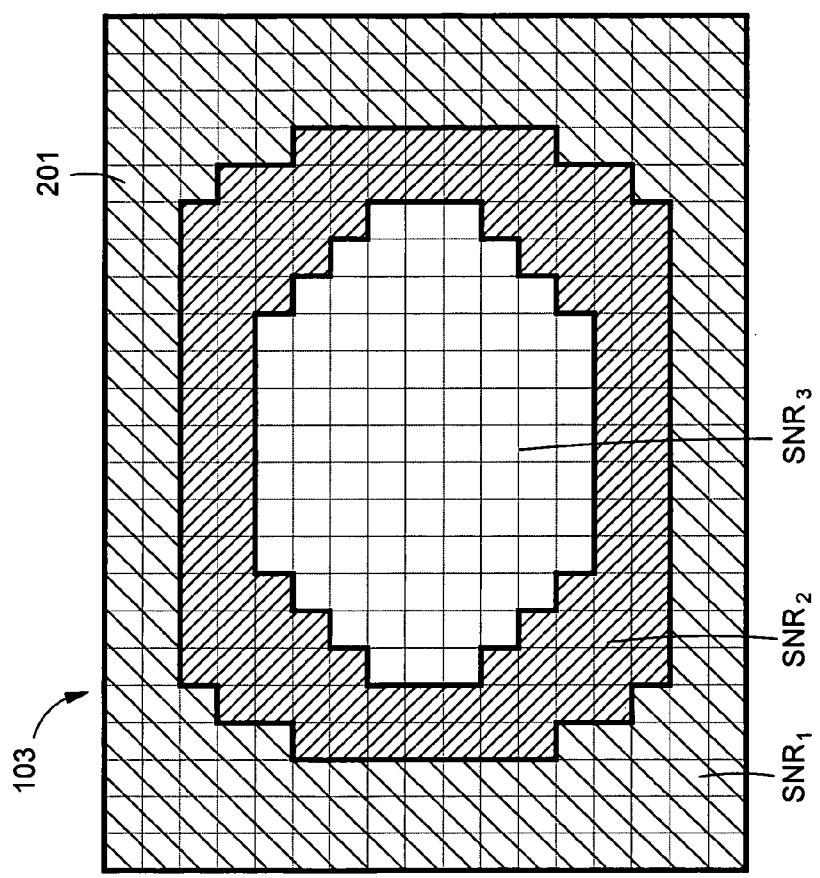
FIG. 2 is a representative diagram of an example volume holographic memory (VHM) according to one embodiment of the present invention.

FIG. 2 illustrates a more detailed view of memory 103. In particular, FIG. 2 shows that memory 103 comprises a plurality of bits 201 (which are delineated by the horizontal and vertical grey gridlines). The total number of bits 201 in memory 103 is the page size (or overall size):

$$N = \text{page\_size} \qquad (1)$$

Sections $SNR_1$, $SNR_2$ and $SNR_3$ are sections of memory 103 having like SNR values. In the present example of memory 103, all of the bits 201 in a particular SNR region have substantially the same SNR value. In addition, the SNR value of bits 201 in section $SNR_1$ is lower than the SNR value of bits 201 in section $SNR_2$, which is lower than the SNR value of bits 201 in section $SNR_3$.

Each SNR section comprises a number of bits $n_b$ ($SNR_i$), where i is the section index (which runs from 1 to 3 in this example). Typically, the number of bits 201 in each SNR section (the size of the section) is unequal. For example, section $SNR_1$ is larger than section $SNR_2$, which is larger than section $SNR_3$. In other words, the number of bits 201 comprising section $SNR_1$ is greater than the number of bits 201 comprising section $SNR_2$, which is greater than the number of bits 201 comprising section $SNR_3$.

The SNR sections of memory 103 define the SNR profile of memory 103. In this regard, it is noted that the SNR profile of memory 103 is typical of the distribution of SNRs values in many VHMs. In particular, the center of a typical VHM channel generally has a higher SNR value than the sections at the periphery of the channel. In the present embodiment, memory 103 shown in FIG. 2 represents the channel having a non-uniform SNR profile represented by sections $SNR_1$, $SNR_2$ and $SNR_3$.

In the following description of a method of generating code words according to the present embodiment, memory 103 (page P of FIG. 1) is the channel to be encoded. However, one skilled in the art would recognize after reading the detailed description that the invention can be applied to any number, or all, of pages 1 to P in the same manner, and more generally, can be applied in other memory environments, with or without the use of a paging system.

Referring to FIGS. 3 through 5B, a method of generating code words according to the present embodiment will now be described.

Figure 3:
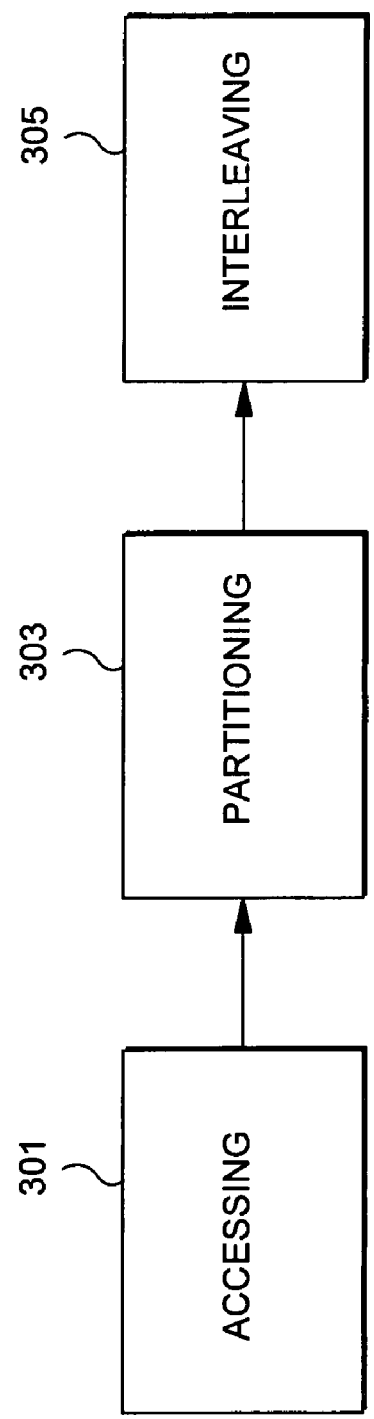
FIG. 3 is a process flowchart of one example method of generating code words according to the present invention.

FIG. 3 is a process flow chart of one method used by code word generator 105 to generate code words for encoding memory 103. Accessing unit 107 accesses (301) the SNR profile of memory 103, which is the channel to be encoded. In particular, accessing unit 107 can access a predetermined SNR profile. In addition, in the case that the SNR profile of a channel is not predetermined, accessing unit 107 can also determine the SNR profile of the channel. For example, accessing unit 107 can insert known patterns (pilot bits or symbols) occasionally in a transmission or during a write-process, and then use these known bits/symbols to determine SNR locally (e.g., in time or in space) and extrapolate for other positions/areas. For instance, in Holographic storage, known patterns can be inserted on pre-determined portions of each page (or for a given pre-determined set of pages). Other methods of determining the SNR profile of a channel could be used, such as computing noise characteristics using statistical processing of received data, e.g., using averaging or other more sophisticated ways to estimate the mean and the variance (and/or other characteristics) of the noise in the channel.

Figure 4:
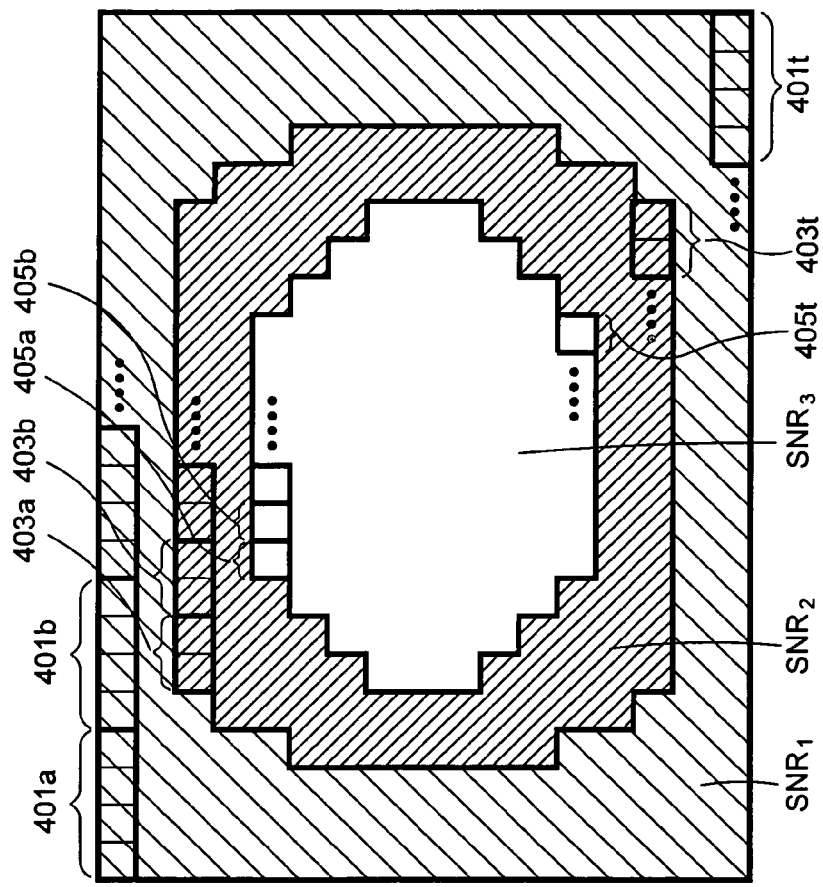
FIG. 4 is a representational diagram illustrating partitioning of SNR sections of a VHM according to one embodiment of the present invention.

The SNR sections of the channel, which are defined by the SNR profile, are partitioned (303) by partitioning unit 109 into a number of partitions. The number of partitions of each SNR section is set to be equal to the number of code words to be used to encode the channel. In this example embodiment, the number of code words is 20. FIG. 4 shows an example of the partitioning (for purposes of illustration, only the first three partitions and the last partition are shown for each SNR section). In particular, section $SNR_1$ is divided into 20 partitions starting with a first partition 401a, a second partition 401b, and ending with a last partition 401t, each partition having a size of four bits. Section $SNR_2$ is divided into 20 partitions starting with a first partition 403a, a second partition 403b, and ending with a last partition 403t, each partition having a size of 2 bits. Section $SNR_3$ is divided into 20 partitions from a first partition 405a, a second partition 405b, and ending with a last partition 405t, each having a size of 1 bit.

It is noted that the figures in the present description are not necessarily drawn to scale. Therefore, apparent attributes of the figures may not appear to correspond to the use of specific number of code words, partition size, etc. as cited in this description.

Figure 5A:
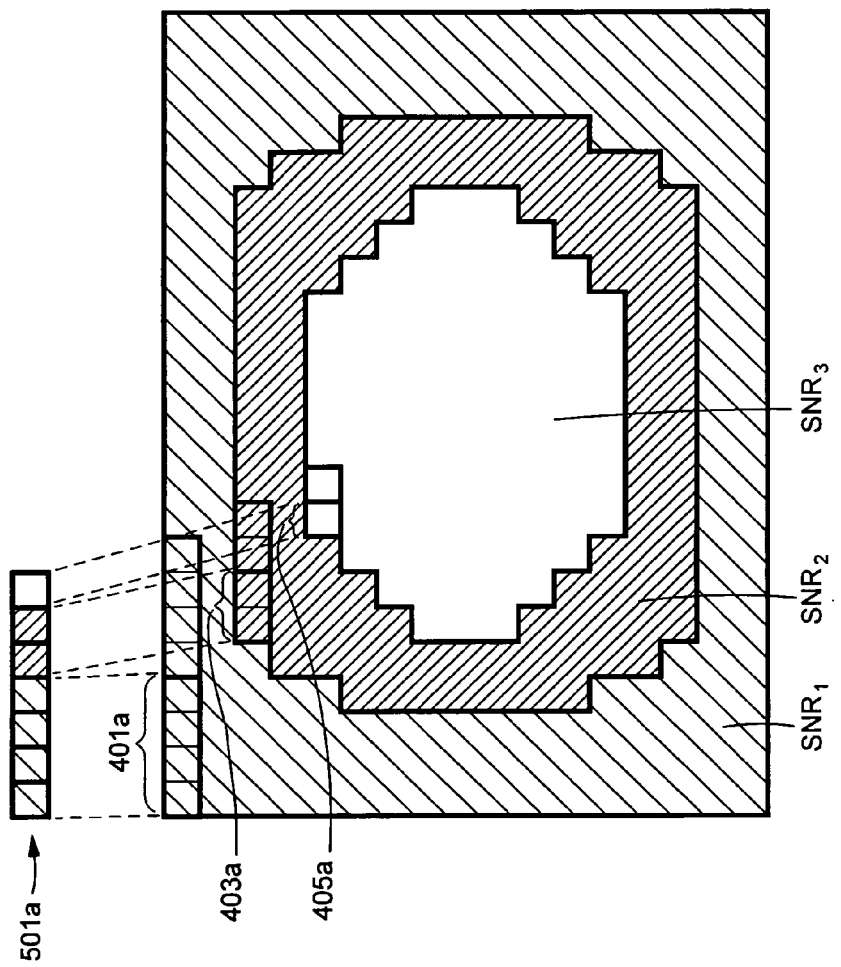
FIGS. 5A and 5B are representational diagrams illustrating interleaving of partitions of SNR sections according to one embodiment of the present invention.
Figure 5B:
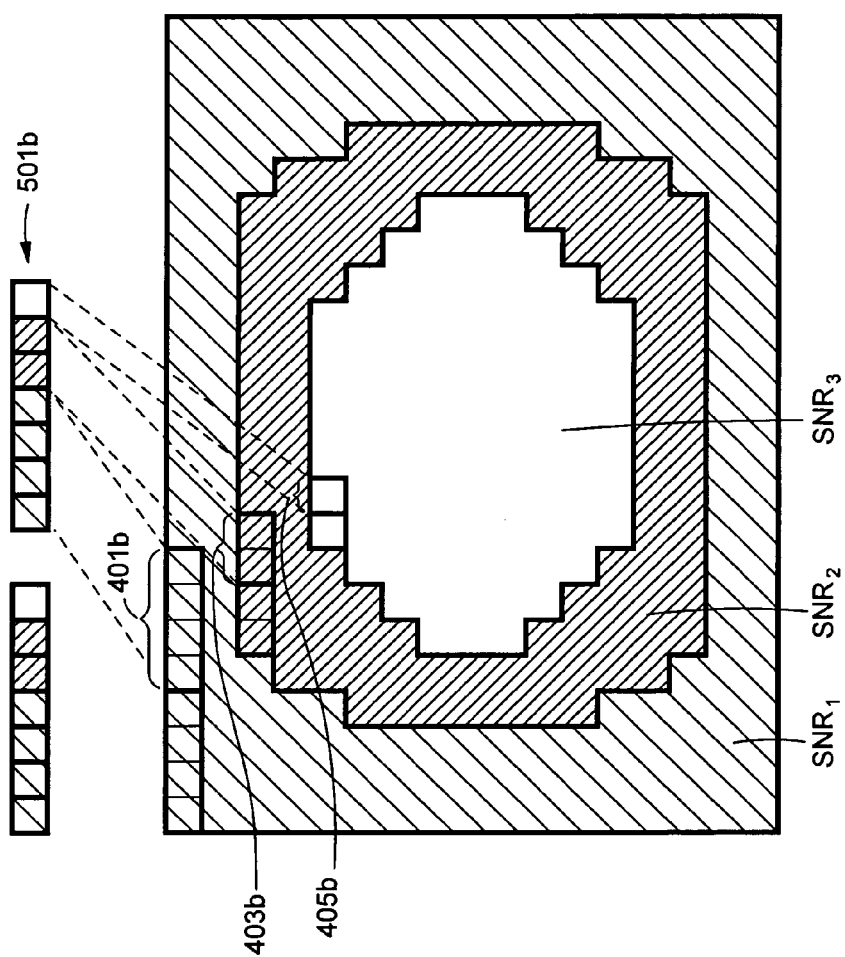

Referring again to FIG. 3, the partitions of each SNR section are interleaved (305) by interleaver 111 to generate code words. FIGS. 5A and 5B illustrate the generation of code words by interleaving partitions from each section. FIG. 5A shows the generation of a first code word 501a. Code word 501a is generated by interleaving the first partition 401a of section $SNR_1$ with the first partition 403a of section $SNR_2$ and the first partition 405a of section $SNR_3$. FIG. 5B shows the generation of a second code word 501b, which is comprised of the second partition 401b of section $SNR_1$, the second partition 403b of section $SNR_2$, and the second partition 405b of section $SNR_3$. As can be seen in FIG. 5B, code word 501a and code word 501b have the same SNR profile, i.e., the same distribution of bits from each of the SNR section of the channel, memory 103. Consequently, code words 501a and 501b have the same average SNR, which is the weighted average of the SNR values of section $SNR_1$, $SNR_2$ and $SNR_3$. More specifically, the average SNR of code words 501a and 501b is:

$$averageSNR = \frac{(4 \cdot SNR_1) + (2 \cdot SNR_2) + (SNR_3)}{7} \quad (2)$$

FIGS. 2, 4, 5A and 5B are directed to a method of generating code words for a data storage memory, such as a volume holographic memory. However, the present embodiment of the invention can also be applied to generate code words for digital data communication signals that have channels with non-uniform SNR. Referring now to FIGS. 1, 3 and 6 through 9, one method of generating code words for a time varying channel, such as a digital data signal, according to the present embodiment will now be described.

FIG. 6 shows a time varying channel, digital data signal 600, which could be for example a digital data signal transmitted over cable, wireless communications, etc. Data signal 600 comprises transmitted bits of data (not individually shown), and the SNR associated with each bit depends on its time of transmission through the channel. Specifically, data signal 600 includes sections $SNR_1$, $SNR_2$ and $SNR_3$, with each SNR section comprising transmitted bits having like SNR values. In the present example of data signal 600, all of the bits in a particular SNR region have substantially the same SNR value. In addition, the SNR value of bits in section $SNR_1$ is lower than the SNR value of bits in section $SNR_2$, which is lower than the SNR value of bits in section $SNR_3$.

In this example, section $SNR_2$ is larger than section $SNR_3$, which is larger than section $SNR_1$. In other words, the number of bits comprising section $SNR_2$ is greater than the number of bits comprising section $SNR_3$, which is greater than the number of bits comprising section $SNR_1$. However, the particular SNR characteristics of a channel, such as a number of SNR sections, section sizes, and location of each section in the channel, will depend on the particular channel.

Code generator 105 of FIG. 1 generates code words for data signal 600, using the method of the present embodiment, shown in FIG. 3. Specifically, accessing unit 107 accesses (301) the SNR profile shown in FIG. 6 for data signal 600. If the SNR profile is not predetermined, accessing 301 can include determining the SNR profile. Partitioning unit 109 partitions (303) each SNR section into a number of partitions. The number of partitions in each SNR section is equal to a number of code words to be used to encode data signal 600. In this example, the number of code words is four.

FIG. 7 shows data signal 600 after partitioning by partitioning unit 109. In particular, each of the sections $SNR_1$, $SNR_2$ and $SNR_3$ is divided into four partitions. The size of the partitions of section $SNR_2$ is greater than the size of the partitions of section $SNR_3$, which is greater than the size of the partitions of section $SNR_1$. In general, the relative partition sizes of the SNR sections reflect the ratios of the sizes of the SNR sections.

Once the SNR sections are partitioned, interleaver 111 interleaves (305) partitions from each SNR section to generate the code words. FIGS. 8 and 9 illustrate the generation of the code words through interleaving. FIG. 8 shows generation of a first code word 801a by interleaving the first partition of section $SNR_1$ section with the first partition of section $SNR_2$ section and the first partition of section $SNR_3$. FIG. 9 shows the generation of a second code word 801b by interleaving the second partition of section $SNR_1$ with the second partition of section $SNR_2$ and the second partition of section $SNR_3$. As FIG. 9 illustrates, code words 801a and 801b are of like SNR profiles due to the partitioning and interleaving of the time or space (e.g., area) varying channel. Accordingly, the average SNR values of code words 801a and 801b are substantially the same.

The method of generating code words according to the present embodiment can provide certain advantages. For example, code words generated by the present embodiment do not include a "lowest common denominator" group of code words (i.e., code words having SNR values of the lowest SNR section of the channel) that dictate the design of the ECC code. Rather, all of the code words of the present embodiment share substantially the same SNR value, which is approximately the average SNR of the channel. Moreover, the average SNR of the channel is, of course, higher than the lowest SNR of the channel. Therefore, the worst (highest) BER associated with code words generated by the present embodiment is typically better than the worst BER of conventionally-generated code words, at the same level of redundancy. One reason for this is that many conventional methods generate at least some code words that are solely associated with the section of lowest SNR value. Consequently, the present embodiment can help to free the ECC code designer from having to design to the "lowest common denominator," that is, the section of the non-uniform channel having the lowest SNR. Instead, the present embodiment can allow the designer to design a code directed to the average SNR value of a non-uniform channel. As a result, code words generated by the present embodiment can be more efficient than traditional code words, since fewer bits of the code words are wasted.

Another embodiment of the present invention will now be discussed with reference to FIGS. 10, 11A and 11B. In the previous embodiment, code words are generated, for example, from individual bits of a storage medium or communication signal. However, some ECC codes generate code words comprising symbols, which themselves comprise individual bits. In particular, symbol-based ECC codes, such as Reed-Solomon codes, are a popular choice for error correction coding of storage media and communication signals in which errors typically occurs in large blocks of data. For example, Reed-Solomon codes are typically used for error correction coding in audio compact discs (CDs), since errors typically occur due to scratches, which obliterate large, continuous sections of data on a CD.

Figure 10:
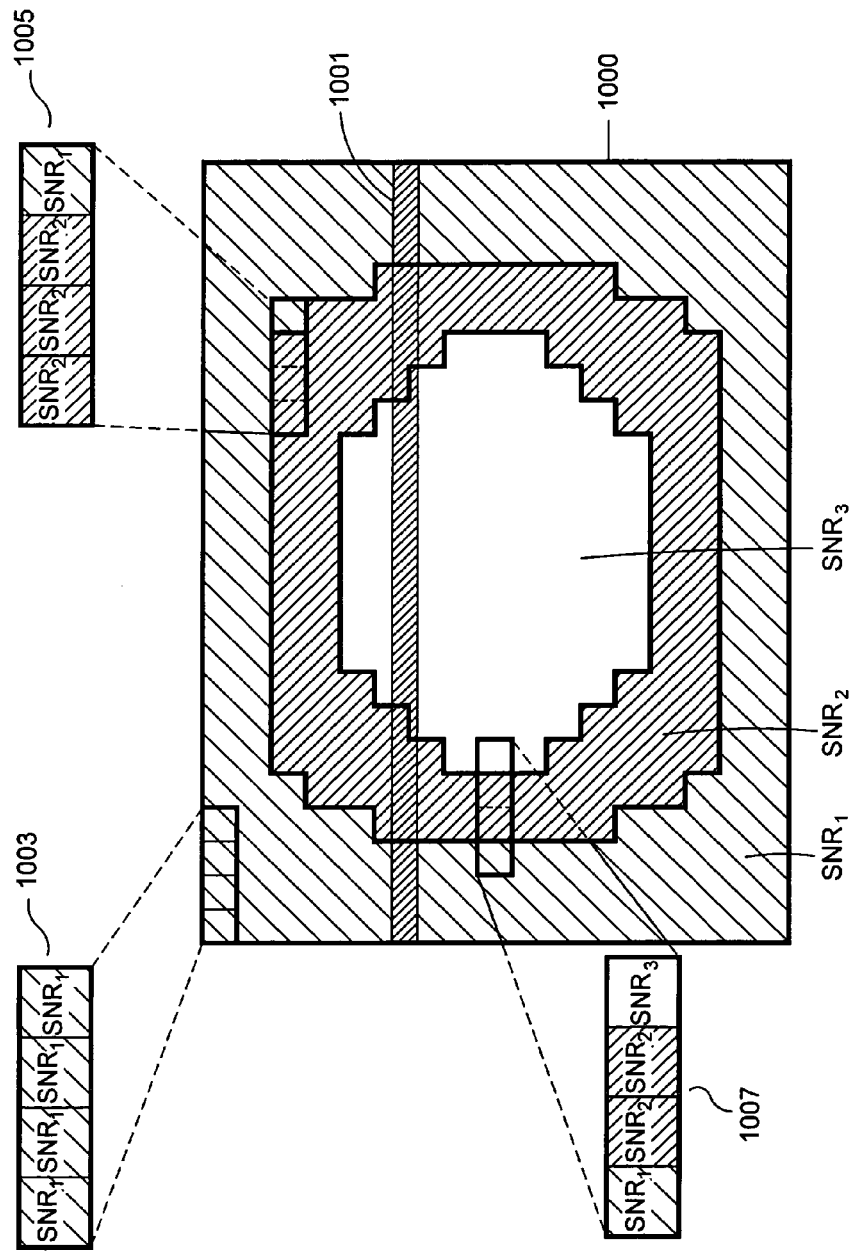
FIG. 10 is a representational diagram of an example VHM in a symbol based ECC coding scenario according to one embodiment of the present invention.

FIG. 10 shows a storage medium 1000 that contains an error 1001. Error 1001 is simply an entire line of bits that has been become unusable. In this situation, symbol-based codes such as Reed-Solomon typically utilize symbols composed of bits that are arranged parallel to the errors occurring in the storage medium, and typically assign symbols without regard to non-uniformity of SNR in a storage medium or signal. For example, FIG. 10 shows three example symbols 1003, 1005 and 1007 to illustrate how a typical assignment of 4-bit Reed-Solomon symbols in a non-uniform channel, such as storage medium 1000, can result in symbols that have different SNR profiles. For example, symbol 1003 is composed entirely of bits from section $SNR_1$. Symbol 1005 is composed of three bits from section $SNR_2$ and one bit from section $SNR_1$. Symbol 1007 is composed of one bit from section $SNR_1$, two bits from section $SNR_2$, and one bit from section $SNR_3$. Consequently, symbols 1003, 1005 and 1007 are associated with different average SNR values. In sum, storage medium 1000 is divided into a plurality of symbols having varying SNR profiles, and these symbols are used to form code words in the given ECC code.

It should be apparent from the channel SNR profile shown in FIG. 10 that a dispersion of 4-bit symbols arranged parallel to error 1001 throughout storage medium 1000 will result in more than three different symbol SNR profiles. However, for the purpose of illustration, all symbols assigned to storage medium 1000 are assumed to have one of the three illustrated symbol SNR profiles in the present example.

In order to account for the different symbol SNR profiles, the present embodiment includes a variation from the previous embodiment. Specifically, rather than accessing the channel SNR profile of storage medium 1000, accessing unit 107 of code word generator 105 accesses (301) the symbol SNR profiles of all of the symbols that will be used to encode storage medium 1000. This can include for example, accessing predetermined symbol SNR profiles of the symbols. In another approach, accessing unit 107 can access the channel SNR profile of storage medium 1000 and calculate the symbol SNR profile of each given symbol. Each symbol has an average SNR value, which is determined by the symbol's SNR profile. Accessing unit 107 groups the symbols into sets of like average SNR values. Therefore, since all symbols have one of the three illustrated symbol SNR profiles (1003, 1005 and 1007), accessing unit 107 groups each symbol into one of three symbol sets.

The first symbol set includes symbols having an average SNR value the same as symbol 1003. In other words, symbols in the first symbol set will all have an average SNR value equal to $SNR_1$. A second symbol set includes symbols having an average SNR value of symbol 1005, which is a weighted average of $SNR_1$ and $SNR_2$. The third set includes symbols having an average SNR value of symbol 1007, which is a weighted average of $SNR_1$, $SNR_2$ and $SNR_3$.

Once the symbols sets are formed, partitioning unit 109 partitions each symbol set into a number of partitions, with the number of partitions being set to equal the number of code words used for the channel. Like the embodiment described above, the size of the partitions of one symbol set might not be the same as the size of the partitions in another symbol set. In other words, partitions in one symbol set can have a different number of symbols than partitions in another symbol set. Once symbol sets are partitioned, interleaver 111 interleaves (305) the partitions in a similar fashion to the previous embodiment. In particular, each code word is formed by interleaving a single partition from each of the symbol sets. In this way, variation of SNR value of symbols used to encode a storage medium can be taken into account in designing a symbol-based ECC code. In addition, similar to the previously described embodiment, the present embodiment provides the advantage that the code words generated are of substantially similar average SNR value, which can allow designers using symbol-level ECC codes to design codes that utilize code words with fewer wasted symbols.

FIG. 10 is directed to implementation of the present embodiment in a storage medium. FIGS. 11A and 11B show how an implementation for a digital data signal in which SNR varies with respect to time. FIG. 11A shows a time varying channel, data signal 1101, which includes three sections of different SNR value: $SNR_1$, $SNR_2$ and $SNR_3$.

As described above, symbol-based ECC codes, such as Reed-Solomon, are popular in situations in which errors occur in a continuous block or area of a storage medium. In digital signal communication, symbol-based codes are popular in situations in which errors occur on a periodic basis over time, such as error 1103 shown in FIG. 11A. Specifically, error 1103 occurs on every fifth bit of data signal 1101. To address repetitive type errors such as error 1103, designers typically form symbols from periodically spaced bits in the communications signal. For example, FIG. 11A shows a first symbol 1105a composed of the $1^{st}$, $6^{th}$, $11^{th}$, $16^{th}$, and $21^{st}$ bits of data signal 1101. Similarly, FIG. 11B shows a second symbol 1105b composed of the $2^{nd}$, $7^{th}$, $12^{th}$, 17th, and $22^{nd}$ bits of data signal 1101. From FIG. 11B it is easy to see that the symbols 1105a and 1105b have different SNR profiles. Symbol 1105a has an SNR profile consisting of 1 bit of $SNR_1$, 3 bits of $SNR_2$ and 1 bit of $SNR_3$. While symbol 1105b consists of 1 bit of $SNR_1$, 2 bits of $SNR_2$ and 2 bits of $SNR_3$. Generation of code words in this situation proceeds as described above. Specifically, accessing unit 107 accesses (301) the symbol SNR profiles of the symbols in the channel, and groups symbols with like SNR values into symbol sets. Partitioning unit 109 partitions (303) each symbol set into a number of partitions equal to the number of code words used to encode data signal 1101. Interleaver 111 interleaves (305) the partitions from each symbol set to generate code words.

Another embodiment of the present invention will now be described with reference to FIGS. 12 through 18. This embodiment is similar to the first embodiment with the exception that a plurality of sets of code words are used to encode a non-uniform SNR channel. Each set of code words can, for example, correspond to a different ECC code used to encode the channel. The use of multiple error-correcting codes can be advantageous when, for example, different code rates or different block lengths (code-word lengths) are preferred. For instance, this is the case when several levels of correction are needed or preferred, such as in concatenated codes and/or in product codes, which consist of at least two component codes. The component codes of such systems are often of different rate (and possibly different length). They can also be entirely different types of codes, e.g., RS codes and LDPC codes, BCH and Turbo Codes, etc.

Figure 12:
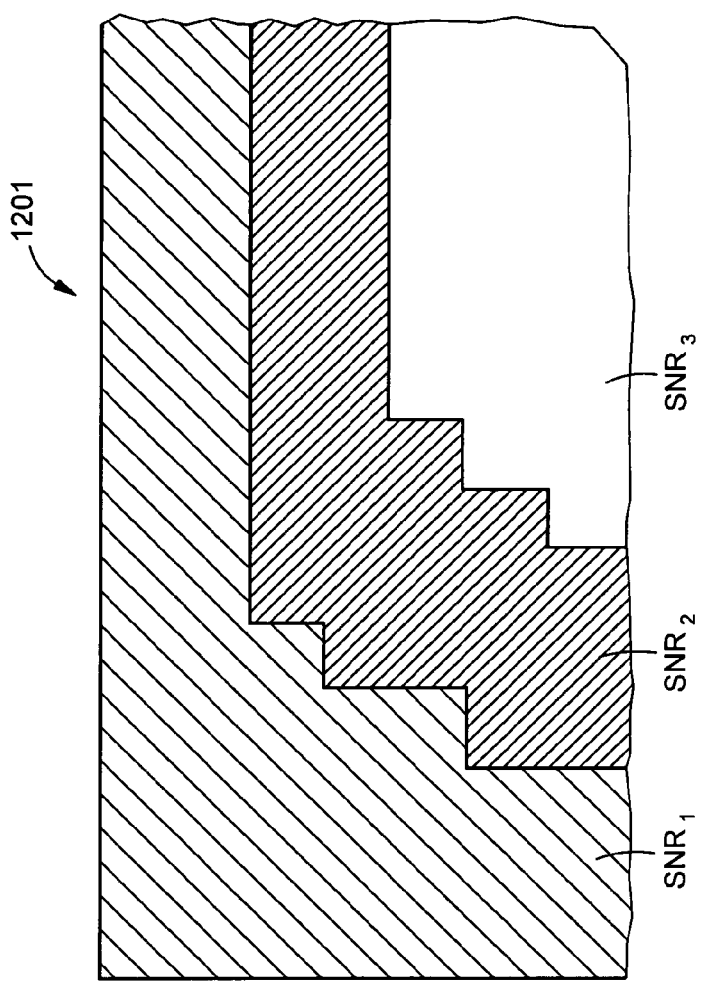
FIG. 12 is a representational diagram of an example VHM according to one embodiment of the present invention.

FIG. 12 is an enlarged view of a portion of a VHM 1201. VHM 1201 has three sections of different SNR values: $SNR_1$, $SNR_2$ and $SNR_3$. As in the first embodiment, $SNR_1<SNR_2<SNR_3$. In the present embodiment VHM 1201 is to be encoded using two sets of code words, each set corresponding to ECC codes of different strengths. In this situation, an ECC code designer may still wish to design codes such that the error rates associated with each set of code words are substantially the same. According to the method of the present embodiment, accessing unit 107 accesses (301) the channel SNR profile of VHM 1201, and partitioning unit 109 partitions (303) each SNR section. However, unlike the previous embodiments, in the present embodiment partitioning unit 109 partitions the sections based on the relative strengths of the ECC codes. In particular, partitioning unit 109 partitions the sections such that error rates associated with each set of code words are made substantially the same.

In the present embodiment, for example, first and second ECC codes are used to encode VHM 1201. The first code and the second code both utilize code words that are seven bits in length. However, the second ECC code is stronger than the first ECC code. Therefore, if the average SNR value of code words of the first ECC code is the same as the average SNR value of code words of the second ECC code, the bit error rates associated with the two sets of code words will differ. Specifically, the bit error rate associated with code words of the second ECC code will be less than the bit error rate associated with code words of the first ECC code.

Figure 13:
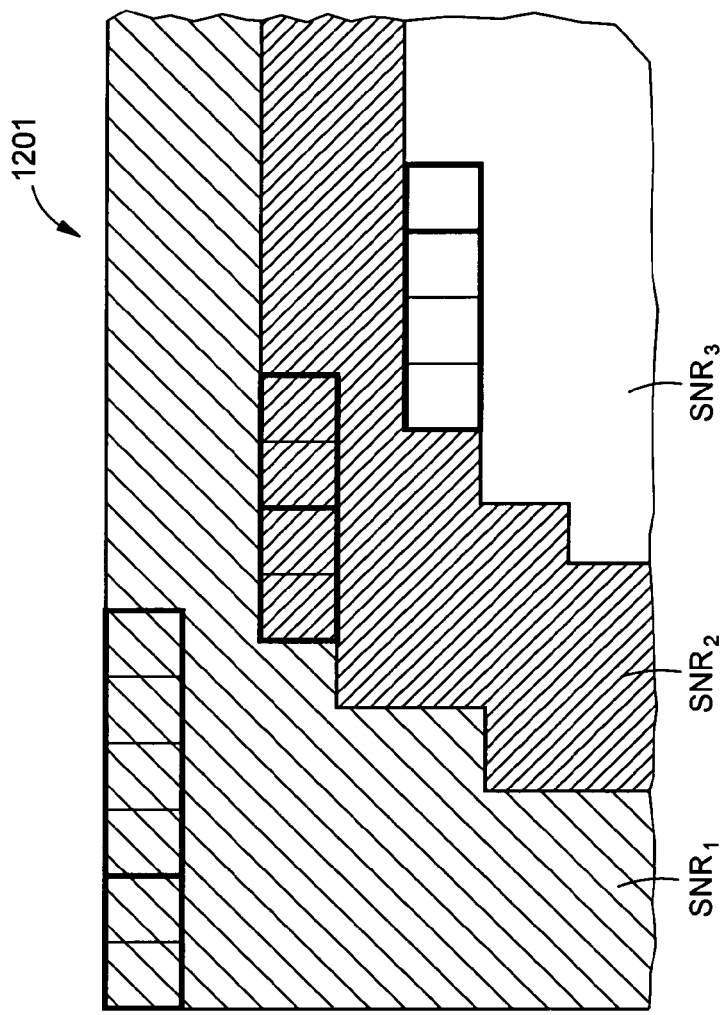
FIG. 13 is a representational diagram illustrating partitioning according to one embodiment of the present invention.

However, in the present embodiment, partitioning unit 109 can partition a particular SNR section into partitions of different sizes based on the relative strengths of the ECC codes. For example, FIG. 13 shows partitions created in the SNR sections by partitioning unit 109. For the purpose of illustration, FIG. 13 shows only the partitions for a single code word of the first ECC code and a single code word of the second ECC code. Specifically, the partitioning scheme of section $SNR_1$ shows a first partition of 2 bits and a second partition of 4 bits. The partitioning scheme for section $SNR_2$ includes a first partition of 2 bits and a second partition of 2 bits. The partitioning scheme of section $SNR_3$ includes a first partition of 3 bits and a second partition of 1 bit.

Figure 14A:
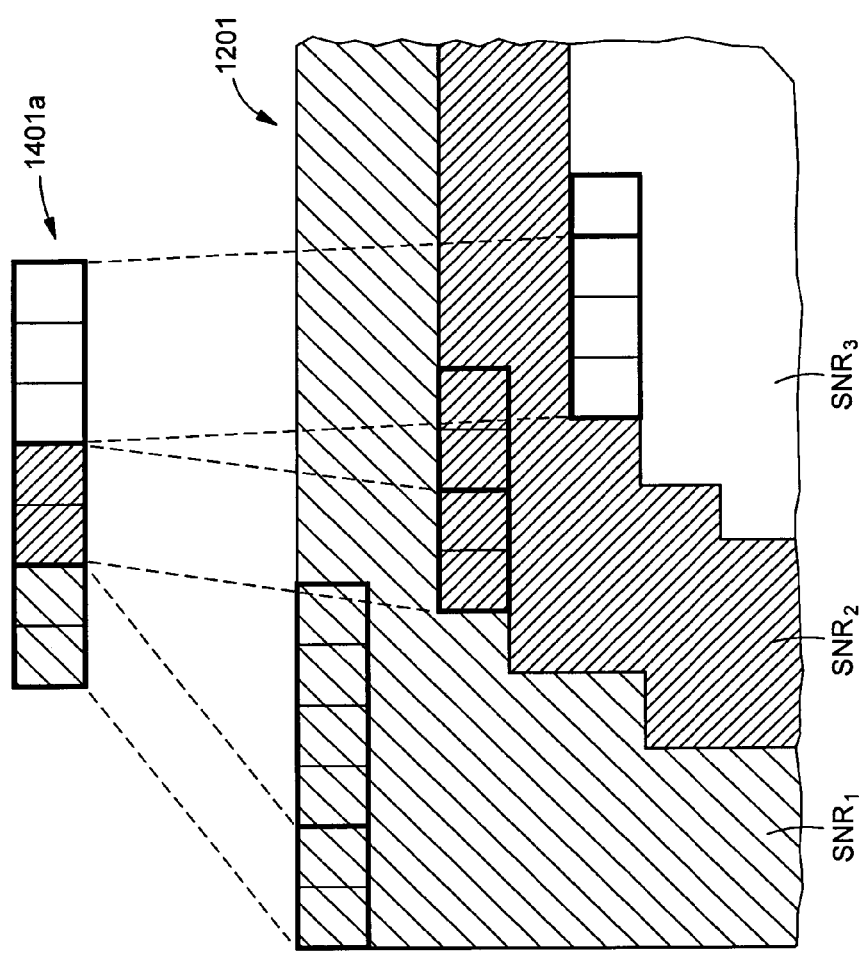
FIGS. 14A and 14B are representational diagrams illustrating the interleaving of partitions according to one embodiment of the present invention.
Figure 14B:
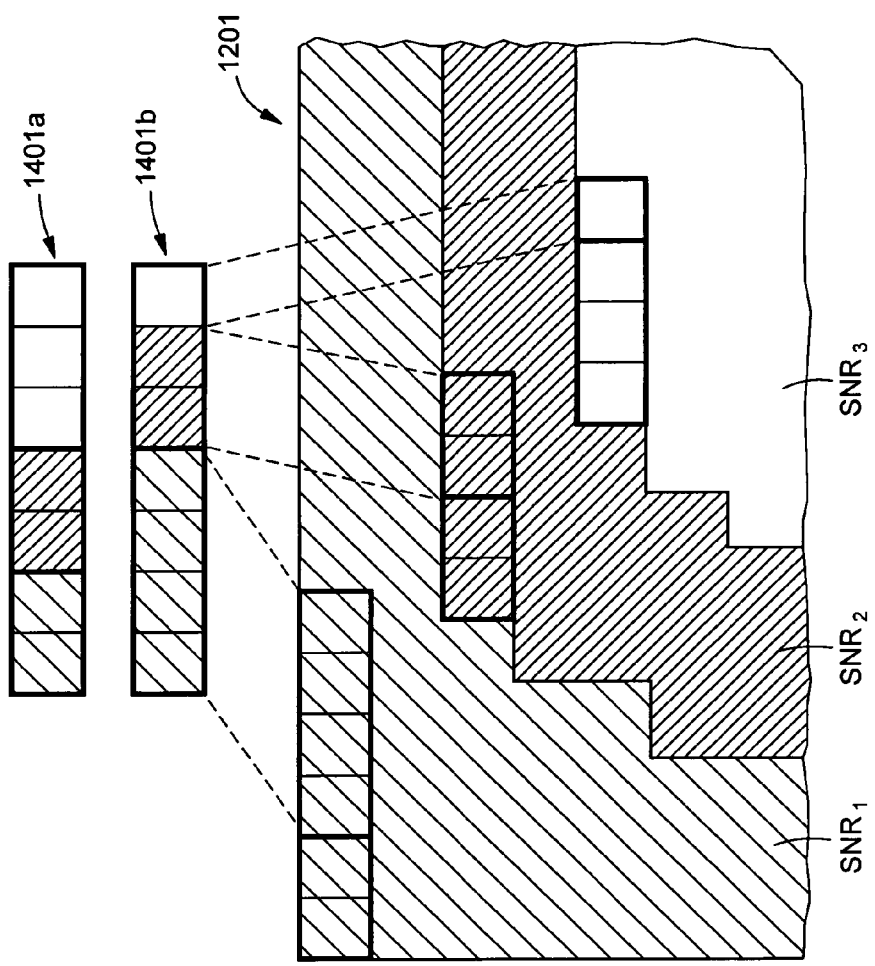

FIGS. 14A and 14B illustrate the operation of interleaver 111 in the present embodiment. Referring now to 14A, interleaver 111 interleaves (305) the first partitions from each SNR section to generate a first code word 1401a of the first ECC code. Consequently, code word 1401a consists of 2 bits from section $SNR_1$, 2 bits from section $SNR_2$, and 3 bits from section $SNR_3$. FIG. 14B shows the generation of a first code word of the second ECC code. Interleaver 111 interleaves (305) the second partitions from each SNR section to generate a first code word 1401b of the second ECC code. Therefore, code word 1401b consists of 4 bits from section $SNR_1$, 2 bits from section $SNR_2$, and 1 bit from section $SNR_3$.

As can readily be seen in FIG. 14B, code word 1401a and code word 1401b have different SNR profiles. In particular, code word 1401a is composed on average of higher SNR bits than code word 1401b. Accordingly, code word 1401a has a higher average SNR value than code word 1401b. However, code word 1401b is stronger than code word 1401a, and hence, code word 1401b is better able to tolerate a lower average SNR value. Preferably, the relative difference in average SNR values of code words 1401a and 1401b will offset the relative difference in the strengths of the code words such that the resulting BERs associated with code words 1401a and 1401b are substantially the same.

Referring now to FIGS. 15 through 18. The application of the present embodiment to time varying channels will now be discussed.

Figure 15:
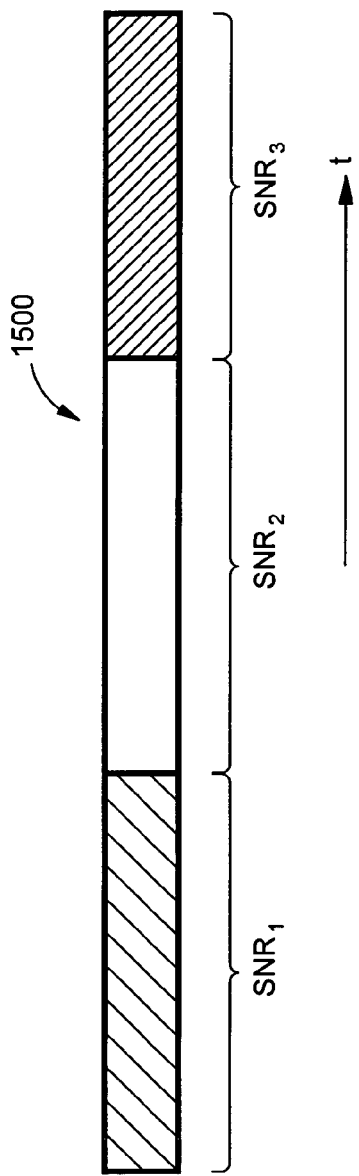
FIG. 15 is a representational diagram of a time varying channel according to one embodiment of the present invention.
Figure 16:
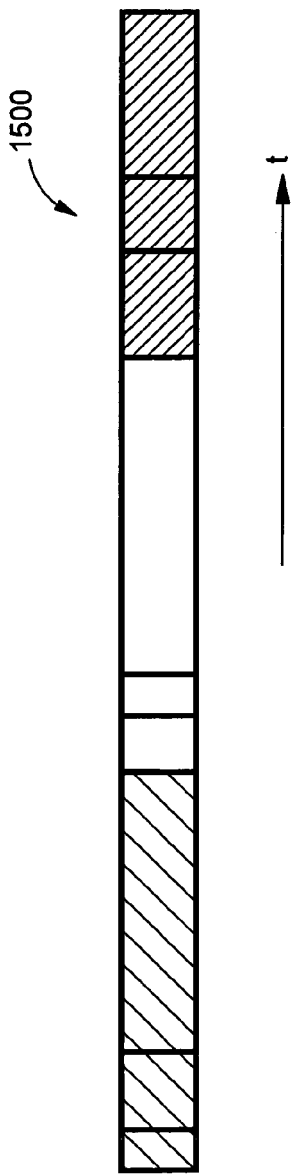
FIG. 16 is a representational diagram illustrating partitioning according to one embodiment of the present invention.

FIG. 15 shows a data signal 1500 that has three sections of different SNR values: $SNR_1$, $SNR_2$ and $SNR_3$. As in the first embodiment, $SNR_1<SNR_2<SNR_3$. Accessing unit 107 accesses (301) accesses the channel SNR profile shown in FIG. 15, and partitioning unit 109 partitions (303) the SNR sections based on the relative strengths of the sets of code words that are to be used to encode the signal. In this case, signal 1500 is to be encoded by two ECC codes. The second ECC code is stronger than the first ECC code. FIG. 16 shows an example result of partitioning unit 109, in which partition sizes in an SNR section are set according to the relative strengths of the ECC codes, as in the partitioning of the VHM discussed above. Partitioning unit 109 assigns a relatively greater amount of high SNR bits to the weaker code words, and a relatively greater amount of low SNR bits to the stronger code words.

Figure 17:
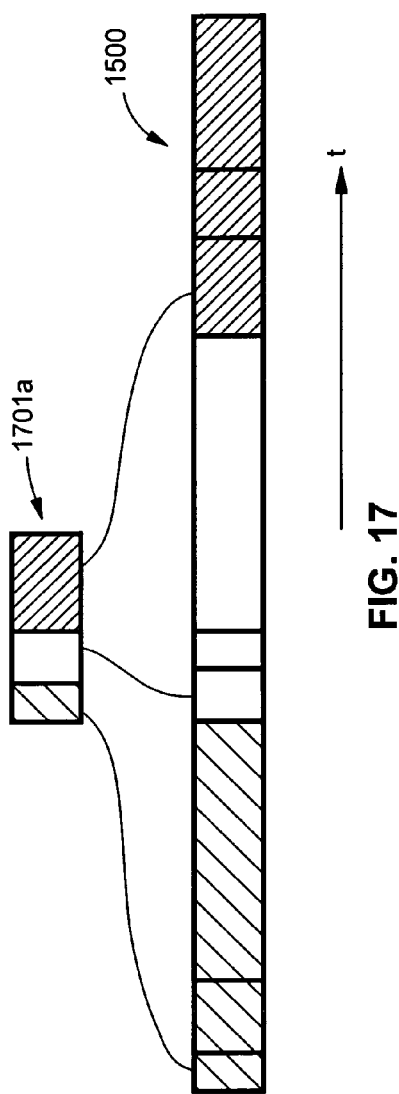
FIGS. 17 and 18 are representational diagrams illustrating the interleaving of partitions according to one embodiment of the present invention.
Figure 18:
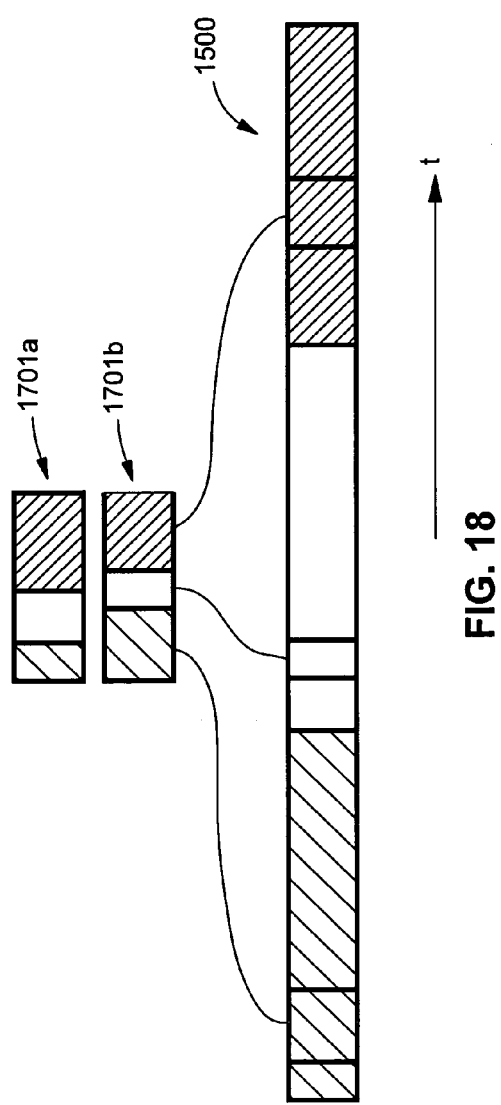

FIGS. 17 and 18 show the operation of interleaver 111 in the present scenario. In particular, FIG. 17 illustrates the generation of a first code word 1701a of the first ECC code. Code word 1701a consists of the first partitions of the SNR sections. FIG. 18 shows the generation of a first code word 1701b of the second ECC code. Code word 1701b consists of the second partitions of the SNR sections. As FIG. 18 illustrates, the average SNR value of code word 1701a is higher than the average SNR value of code word 1701b, since code word 1701a contains a greater proportion of higher SNR bits than code word 1701b.

As in the storage medium implementation of the present embodiment, the difference in average SNR values of code words 1701a and 1701b preferably offsets the difference in strengths of code words 1701a and 1701b such that the BERs associated with the two sets of codes words are substantially the same.

In sum, the present embodiment can aid the ECC code designer in designing a more efficient coding scheme when using two or more ECC codes. In particular, since the average SNR values of the various code words in such a coding scheme can be set to compensate for the relative strengths of the code words, the present embodiment can actually exploit the non-uniformity of a channel to reduce or to eliminate a "lowest common denominator" set of code words.

Figure 19:
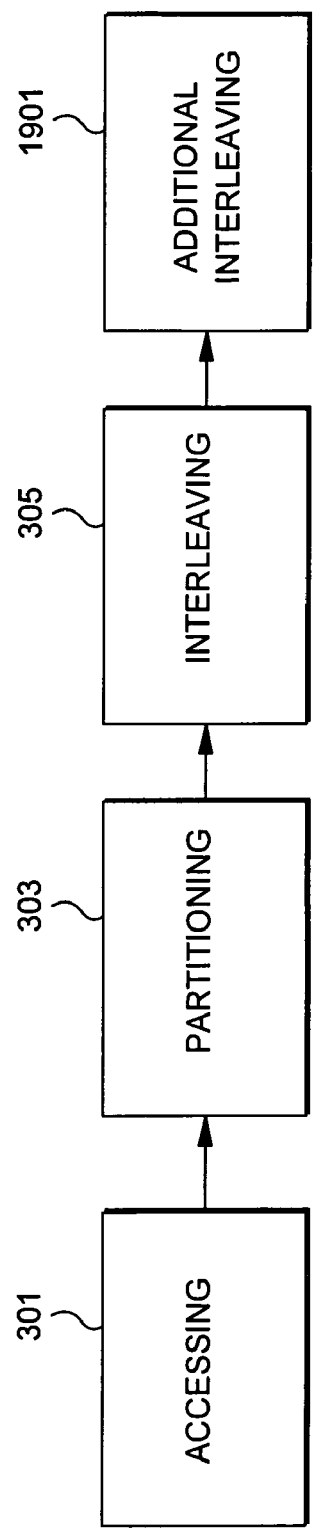
FIG. 19 is a process flowchart of one example method of generating code words according to the present invention.
Figure 20A:
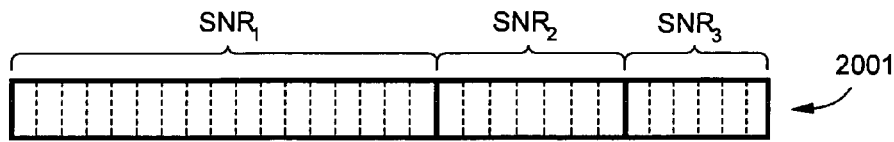
FIGS. 20A through 20D are representational diagrams illustrating an additional interleaving according to one embodiment of the present invention.

Another embodiment of the present invention will now be described with reference to FIGS. 19 through 20C. FIG. 19 shows a method of generating code words according to the present embodiment. In particular, the accessing 301, partitioning 303 and interleaving 305 of the present embodiment are the same as the previous embodiments. However, the present embodiment includes an additional interleaving 1901, which will be described in more detail below. Additional interleaving 1901 can be added to any of the previous embodiments. In particular, additional interleaving 1901 can be used when code words for a storage medium or data signal are predefined. For example, a conventional ECC code could have been created for a particular VHM. The present embodiment can modify the bit or symbol distribution of pre-defined code words to be better suited for channels with non-uniform SNR.

In particular, conventional ECC codes typically utilize code words whose data is stored as a continuous block of data in a storage medium or transmitted as a continuous block of bits in a data signal. In addition, the individual bits or symbols of a code word can have different strengths, depending on the design of the ECC code. The distribution bits or symbols of different strengths in a code word typically reflects these design considerations. For example, in some conventionally designed code words, weaker data bits are interspersed among stronger data bits. That is data bits of like strengths are spread out in the code word.

However, the design of conventional ECC codes does not take into account an SNR profile of code words, which results from generation of code words according to the present invention. For example, FIG. 20A shows a code word 2001 that could have been generated by any of the previously described embodiments. Code word 2001 contains three regions of different SNR values: $SNR_1$, $SNR_2$ and $SNR_3$, each SNR section identifies particular bits or symbols of the respective SNR values in the storage medium or data signal. In other words, code word 2001 is a map that defines where each bit or symbol of the code word will be stored in a storage medium or transmitted in a data signal. For the purpose of illustration, code word 2001 comprises 28 bits of a storage medium. The first 14 bits define storage locations in a section of $SNR_1$, the next 8 bits define storage locations in a section of $SNR_2$ and the last 6 bits define storage locations in a section of $SNR_3$. In other words, when the actual data, i.e., original data and parity bits or symbols, are processed by the ECC code, code word 2001 defines that the first 14 bits of the actual data placed in the code word will be stored in bits of section $SNR_1$, the next 8 bits of actual data placed in the code word will be stored in bits of section $SNR_2$, and the last 6 bits of actual data placed in the code word will be stored in bits of section $SNR_3$.

If an ECC code designer is not restricted to using a predefined ECC code, a "from scratch" ECC code can take into consideration the SNR profile of the generated code word 2001, particularly in the design of the distribution of strengths of the individual bits of the code word. For example, when designing an ECC code to utilize code word 2001, it might be best to place the 14 strongest bits of data at the beginning of the code word so that they are stored in the region of lowest SNR in the channel, i.e., $SNR_1$. It follows that the six weakest bits of data should then be located at the end of the code word so that they are stored in the section of highest SNR value, i.e., $SNR_3$. The remaining bits, of course would then be stored in section $SNR_2$. In this way an ECC code may be designed based on the code words generated by the above embodiments to take advantage of the non-uniformity of the SNR values in the channel by storing the most protected or strongest bits in sections of the channel with lower SNR values since the stronger bits are better able to handle low SNR. Likewise, the weakest bits can be stored in sections of higher SNR values in the channel. Since these bits are less able to handle low SNR values.

On the other hand, if a conventional ECC code is used, the distribution of bits of various strength in the code words is predetermined, and is not likely to conform to the above design goal.

However, additional interleaving 1901 of the present embodiment reorders the bits of data in the given code word according to the strength of the bits. In this way, a conventionally generated code word may be placed in a more suitable form for use in encoding a non-uniform channel.

Figure 20B:
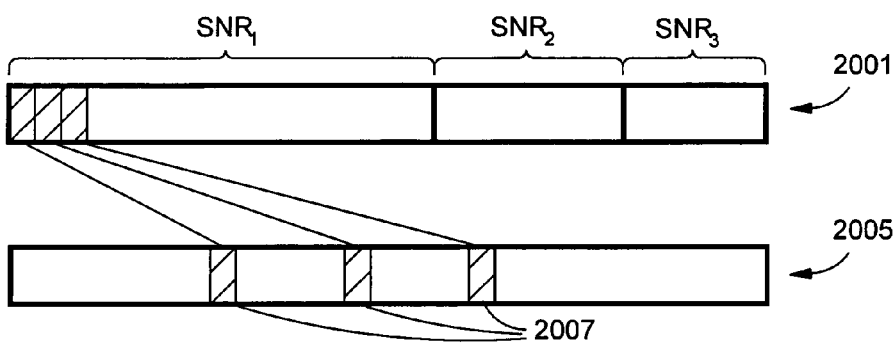
Figure 20C:
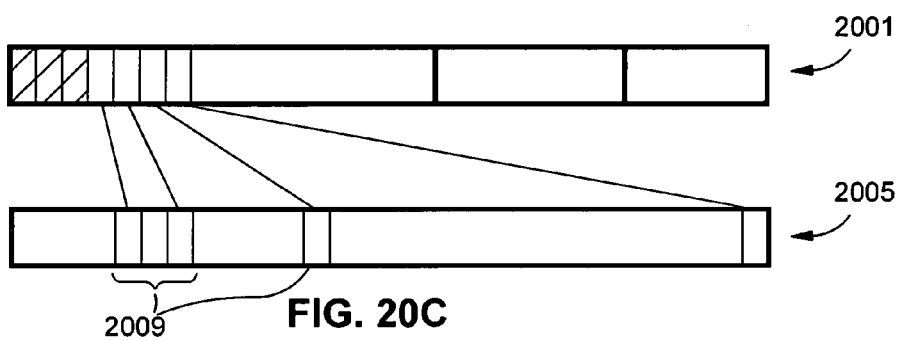
Figure 20D:
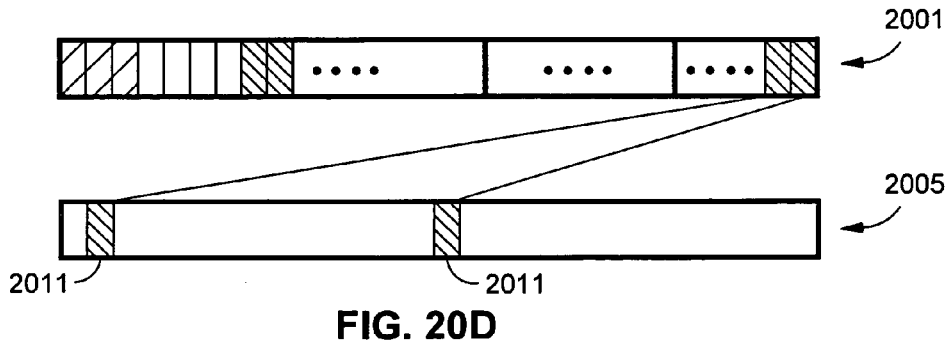

Referring now to FIG. 20B a conventionally generating code word 2005 is provided. Code word 2005 includes most protected bits 2007, which are shown distributed throughout code word 2005. According to the present embodiment, additional interleaving 1901 interleaves bits 2007 to correspond with the first 3 bits in code word 2001, which correspond to section $SNR_1$ of the channel. Next, the additional interleaving 1901 selects the next most protected bits 2009 in code word 2005, and interleaves them such that they correspond to the next 4 bits in code word 2001, which also corresponds to section $SNR_1$ of the channel. FIG. 20D shows the end of the additional interleaving process in which the least protected bits 2011 of code word 2005 are interleaved to correspond to the last two bits in code word 2001, which correspond to section $SNR_3$ of the channel. In this way, a predetermined code word that is generated by a conventional ECC coding method can be rearranged to be better suited for a non-uniform channel.

It should be noted that additional interleaving 1901 is optional. In particular, conventionally generated code words can be used with the previous embodiments of the invention without modification. For example, if a designer is given predefined code words with which to encode a non-uniform channel, the designer can utilize the SNR profile of code words generated by the above embodiments directly. For example, given a predefined code word of 28 bits, a designer can simply utilize generated code word 2001 to store the first 14 bits of the predefined code word in section $SNR_1$, the next 8 bits in section $SNR_2$, and the last 6 bits in section $SNR_3$. Using predefined code words directly with the SNR profiles of code words generated by the present invention can still provide the advantages discussed with respect to each of the above embodiments.

In general, the present invention can be implemented in any system that utilizes a data storage device or data signal transmission having a non-uniform SNR profile. To the extent that the following exemplary implementations utilize channels of non-uniform SNR, the present invention is applicable.

Figure 21A:
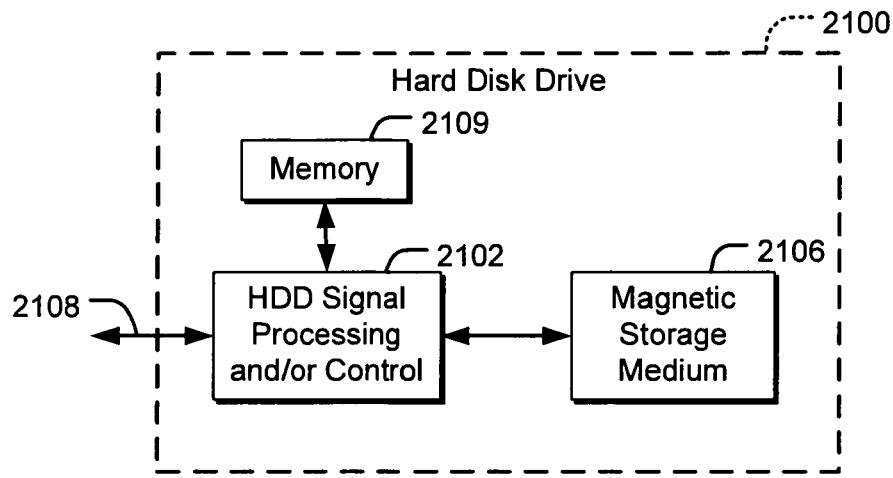
FIG. 21A is a block diagram showing an embodiment of the invention in a hard disk drive.

Referring now to FIGS. 21A-21H, various exemplary implementations of the present invention are shown. Referring to FIG. 21A, the present invention may be embodied as a code word generator for a hard disk drive 2100. The present invention may implement either or both signal processing and/or control circuits, which are generally identified in FIG. 21A at 2102. In some implementations, signal processing and/or control circuit 2102 and/or other circuits (not shown) in HDD 2100 may process data, perform coding and/or encryption, perform calculations, and/or format data that is output to and/or received from a magnetic storage medium 2106.

HDD 2100 may communicate with a host device (not shown) such as a computer, mobile computing devices such as personal digital assistants, cellular phones, media or MP3 players and the like, and/or other devices via one or more wired or wireless communication links 2108. HDD 2100 may be connected to memory 2109, such as random access memory (RAM), a low latency nonvolatile memory such as flash memory, read only memory (ROM) and/or other suitable electronic data storage.

Figure 21B:
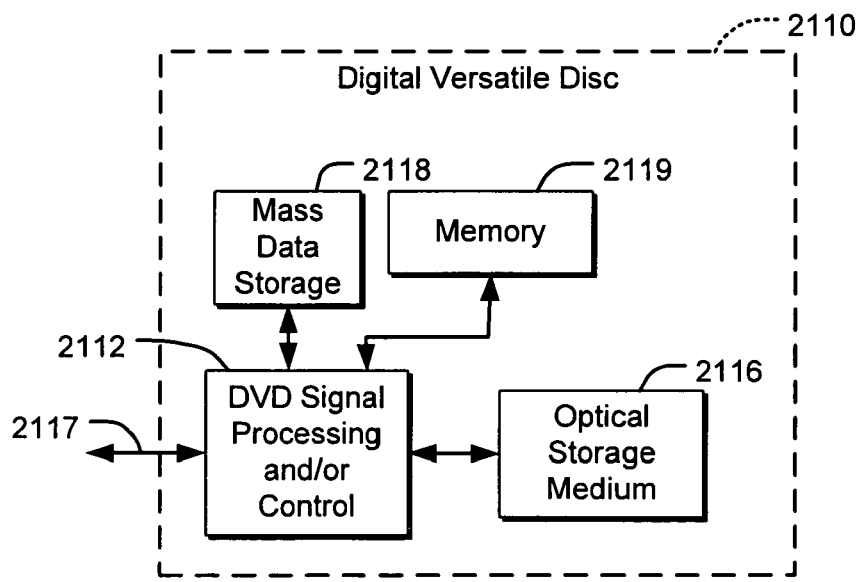
FIG. 21B is a block diagram of the invention in a DVD drive.

Referring now to FIG. 21B, the present invention may be embodied in a digital versatile disc (DVD) drive 2110. The present invention may implement either or both signal processing and/or control circuits, which are generally identified in FIG. 21B at 2112, and/or mass data storage 2118 of DVD drive 2110. Signal processing and/or control circuit 2112 and/or other circuits (not shown) in DVD 2110 may process data, perform coding and/or encryption, perform calculations, and/or format data that is read from and/or data written to an optical storage medium 2116. In some implementations, signal processing and/or control circuit 2112 and/or other circuits (not shown) in DVD 2110 can also perform other functions such as encoding and/or decoding and/or any other signal processing functions associated with a DVD drive.

DVD drive 2110 may communicate with an output device (not shown) such as a computer, television or other device via one or more wired or wireless communication links 2117. DVD 2110 may communicate with mass data storage 2118 that stores data in a nonvolatile manner. Mass data storage 2118 may include a hard disk drive (HDD) such as that shown in FIG. 21A. The HDD may be a mini HDD that includes one or more platters having a diameter that is smaller than approximately 1.8". DVD 2110 may be connected to memory 2119, such as RAM, ROM, low latency nonvolatile memory such as flash memory, and/or other suitable electronic data storage.

Figure 21C:
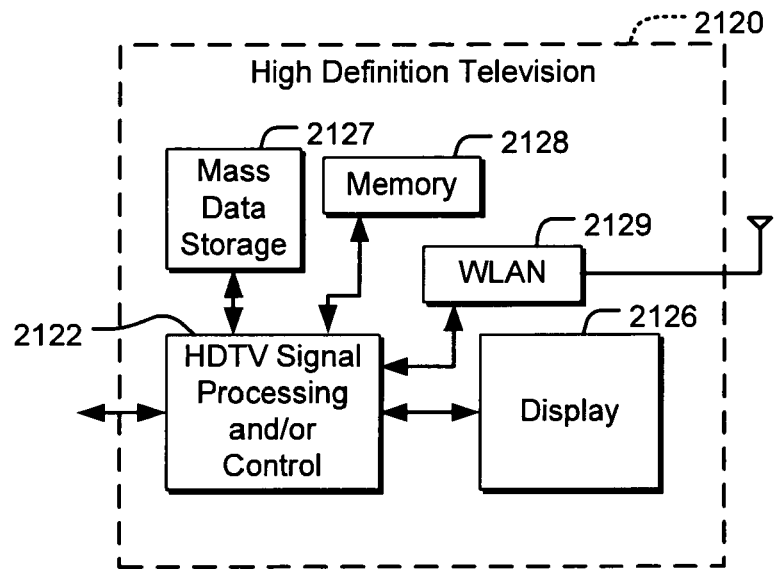
FIG. 21C is a block diagram of the invention in a high definition television (HDTV).

Referring now to FIG. 21C, the present invention may be embodied in a high definition television (HDTV) 2120. The present invention may implement either or both signal processing and/or control circuits, which are generally identified in FIG. 21C at 2122, a WLAN interface and/or mass data storage of the HDTV 2120. HDTV 2120 receives HDTV input signals in either a wired or wireless format and generates HDTV output signals for a display 2126. In some implementations, signal processing circuit and/or control circuit 2122 and/or other circuits (not shown) of HDTV 2120 may process data, perform coding and/or encryption, perform calculations, format data and/or perform any other type of HDTV processing that may be required.

HDTV 2120 may communicate with mass data storage 2127 that stores data in a nonvolatile manner such as optical and/or magnetic storage devices. At least one HDD may have the configuration shown in FIG. 21A and/or at least one DVD may have the configuration shown in FIG. 21B. The HDD may be a mini HDD that includes one or more platters having a diameter that is smaller than approximately 1.8". HDTV 2120 may be connected to memory 2128 such as RAM, ROM, low latency nonvolatile memory such as flash memory and/or other suitable electronic data storage. HDTV 2120 also may support connections with a WLAN via a WLAN network interface 2129.

Figure 21D:
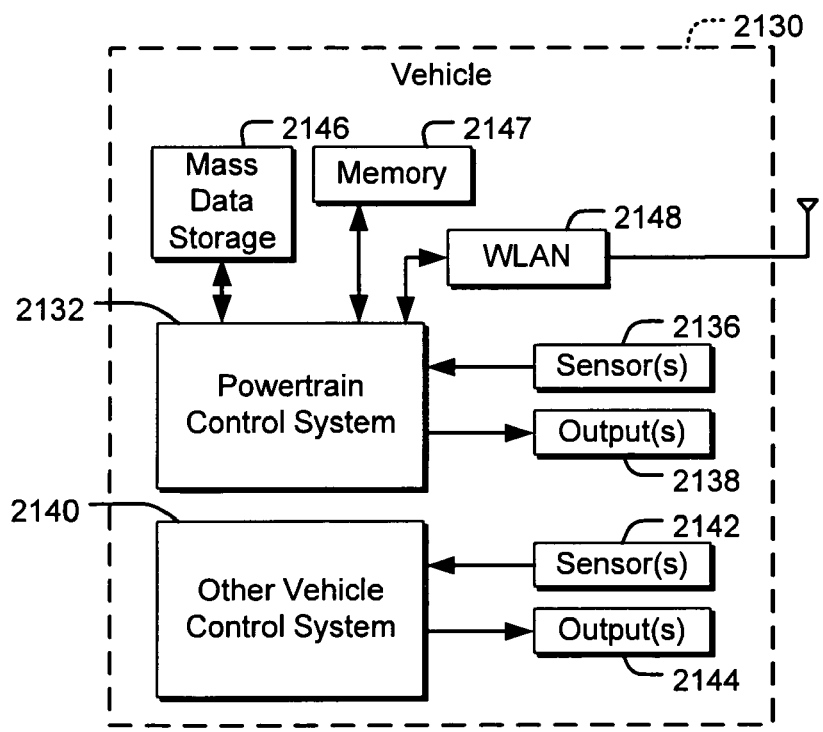
FIG. 21D is a block diagram of the invention in a vehicle control system.

Referring now to FIG. 21D, the present invention implements a control system of a vehicle 2130, a WLAN interface and/or mass data storage of the vehicle control system. In some implementations, the present invention implements a powertrain control system 2132 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 2140 of vehicle 2130. Control system 2140 may likewise receive signals from input sensors 2142 and/or output control signals to one or more output devices 2144. In some implementations, control system 2140 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 2132 may communicate with mass data storage 2146 that stores data in a nonvolatile manner. Mass data storage 2146 may include optical and/or magnetic storage devices for example hard disk drives HDD and/or DVDs. At least one HDD may have the configuration shown in FIG. 21A and/or at least one DVD may have the configuration shown in FIG. 21B. The HDD may be a mini HDD that includes one or more platters having a diameter that is smaller than approximately 1.8". Powertrain control system 2132 may be connected to memory 2147 such as RAM, ROM, low latency nonvolatile memory such as flash memory and/or other suitable electronic data storage. Powertrain control system 2132 also may support connections with a WLAN via a WLAN network interface 2148. The control system 2140 may also include mass data storage, memory and/or a WLAN interface (all not shown).

Figure 21E:
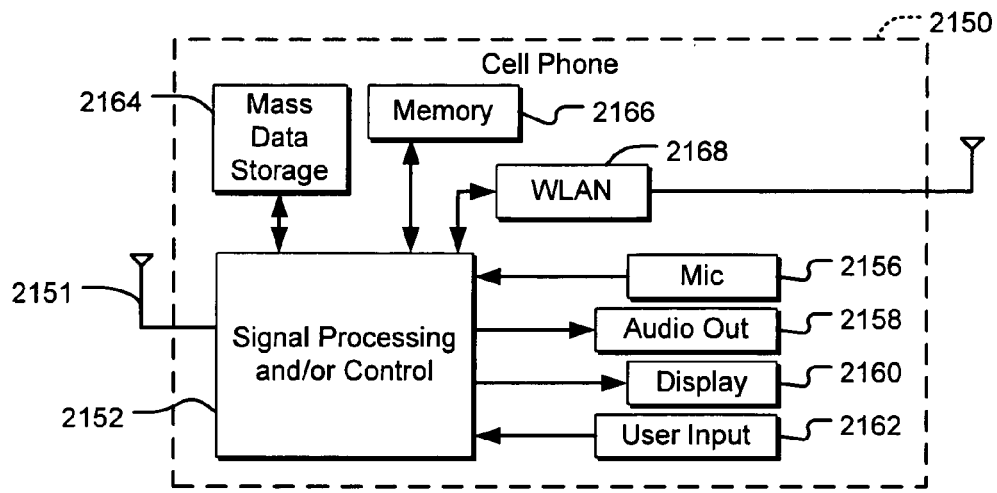
FIG. 21E is a block diagram of the invention in a cellular or mobile phone.

Referring now to FIG. 21E, the present invention may be embodied in a cellular phone 2150 that may include a cellular antenna 2151. The present invention may implement either or both signal processing and/or control circuits, which are generally identified in FIG. 21E at 2152, a WLAN interface and/or mass data storage of the cellular phone 2150. In some implementations, cellular phone 2150 includes a microphone 2156, an audio output 2158 such as a speaker and/or audio output jack, a display 2160 and/or an input device 2162 such as a keypad, pointing device, voice actuation and/or other input device. Signal processing and/or control circuits 2152 and/or other circuits (not shown) in cellular phone 2150 may process data, perform coding and/or encryption, perform calculations, format data and/or perform other cellular phone functions.

Cellular phone 2150 may communicate with mass data storage 2164 that stores data in a nonvolatile manner such as optical and/or magnetic storage devices for example hard disk drives HDD and/or DVDs. At least one HDD may have the configuration shown in FIG. 21A and/or at least one DVD may have the configuration shown in FIG. 21B. The HDD may be a mini HDD that includes one or more platters having a diameter that is smaller than approximately 1.8". Cellular phone 2150 may be connected to memory 2166 such as RAM, ROM, low latency nonvolatile memory such as flash memory and/or other suitable electronic data storage. Cellular phone 2150 also may support connections with a WLAN via a WLAN network interface 2168.

Figure 21F:
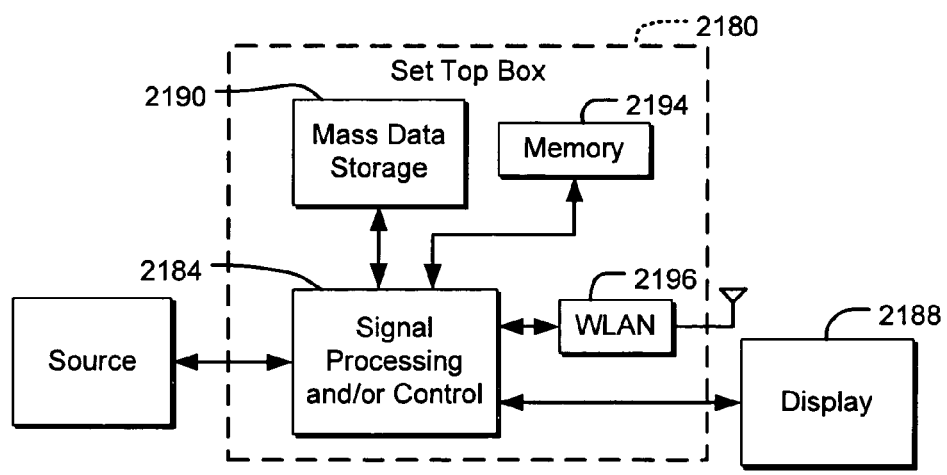
FIG. 21F is a block diagram of the invention in a set-top box (STB).

Referring now to FIG. 21F, the present invention may be embodied in a set top box 2180. The present invention may implement either or both signal processing and/or control circuits, which are generally identified in FIG. 21F at 2184, a WLAN interface and/or mass data storage of the set top box 2180. Set top box 2180 receives signals from a source such as a broadband source and outputs standard and/or high definition audio/video signals suitable for a display 2188 such as a television and/or monitor and/or other video and/or audio output devices. Signal processing and/or control circuits 2184 and/or other circuits (not shown) of the set top box 2180 may process data, perform coding and/or encryption, perform calculations, format data and/or perform any other set top box function.

Set top box 2180 may communicate with mass data storage 2190 that stores data in a nonvolatile manner. Mass data storage 2190 may include optical and/or magnetic storage devices for example hard disk drives HDD and/or DVDs. At least one HDD may have the configuration shown in FIG. 21A and/or at least one DVD may have the configuration shown in FIG. 21B. The HDD may be a mini HDD that includes one or more platters having a diameter that is smaller than approximately 1.8". Set top box 2180 may be connected to memory 2194 such as RAM, ROM, low latency nonvolatile memory such as flash memory and/or other suitable electronic data storage. Set top box 2180 also may support connections with a WLAN via a WLAN network interface 2196.

Figure 21G:
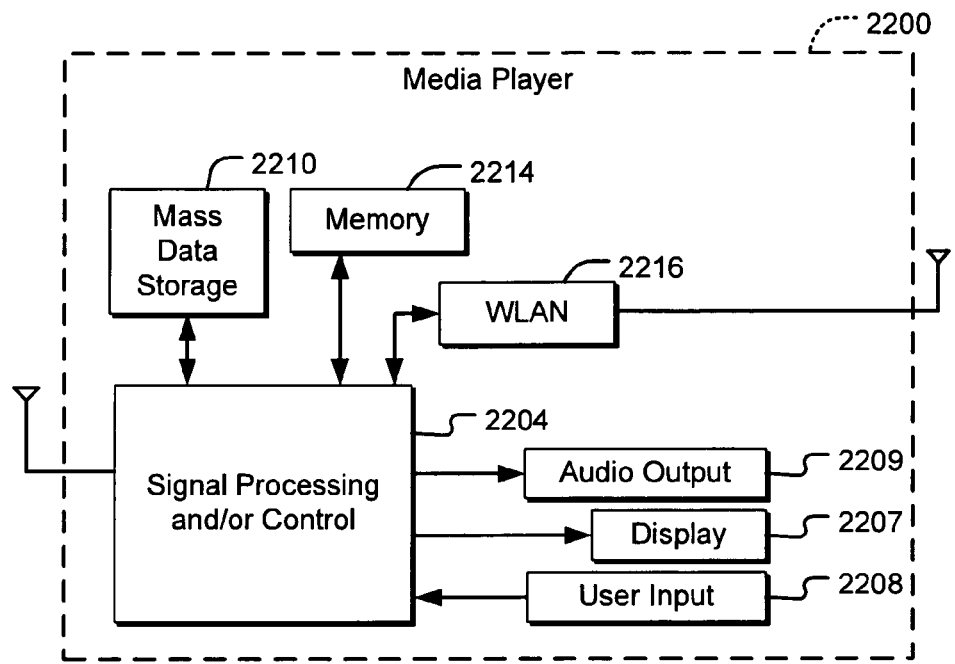
FIG. 21G is a block diagram of the invention in a media player.

Referring now to FIG. 21G, the present invention may be embodied in a media player 2200. The present invention may implement either or both signal processing and/or control circuits, which are generally identified in FIG. 21G at 2204, a WLAN interface and/or mass data storage of the media player 2200. In some implementations, media player 2200 includes a display 2207 and/or a user input 2208 such as a keypad, touchpad and the like. In some implementations, media player 2200 may employ a graphical user interface (GUI) that typically employs menus, drop down menus, icons and/or a point-and-click interface via display 2207 and/or user input 2208. Media player 2200 further includes an audio output 2209 such as a speaker and/or audio output jack. Signal processing and/or control circuits 2204 and/or other circuits (not shown) of media player 2200 may process data, perform coding and/or encryption, perform calculations, format data and/or perform any other media player function.

Media player 2200 may communicate with mass data storage 2210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 21A and/or at least one DVD may have the configuration shown in FIG. 21B. The HDD may be a mini HDD that includes one or more platters having a diameter that is smaller than approximately 1.8". Media player 2200 may be connected to memory 2214 such as RAM, ROM, low latency nonvolatile memory such as flash memory and/or other suitable electronic data storage. Media player 2200 also may support connections with a WLAN via a WLAN network interface 2216. Still other implementations in addition to those described above are contemplated.

Figure 21H:
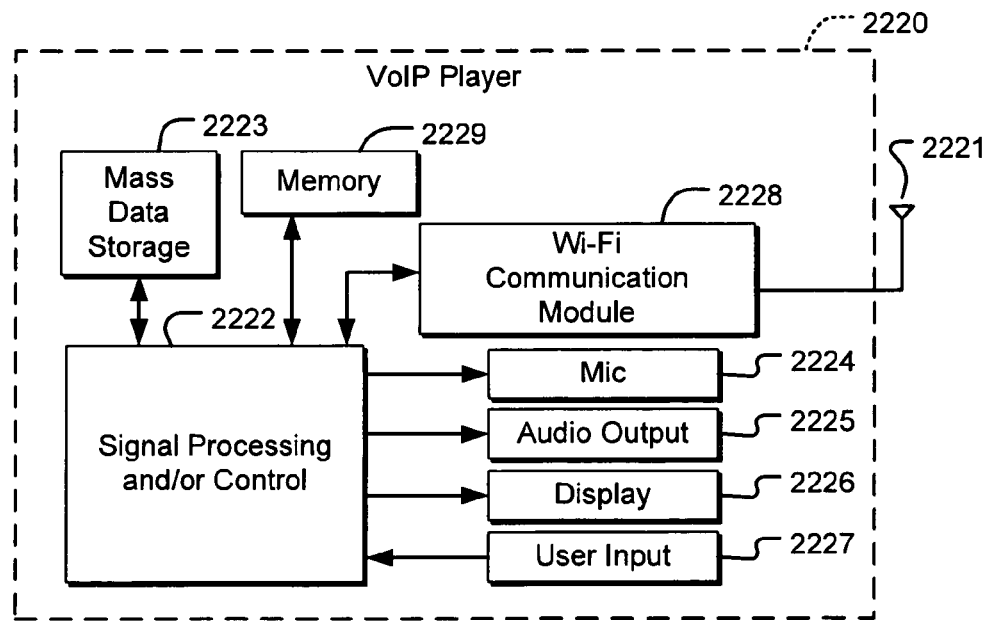
FIG. 21H is a block diagram of the invention in a VoIP player.

Referring to FIG. 21H, the present invention may be embodied in a Voice over Internet Protocol (VoIP) phone 2250 that may include an antenna 2218. The present invention may implement either or both signal processing and/or control circuits, which are generally identified in FIG. 21H at 2204, a wireless interface and/or mass data storage of the VoIP phone 2250. In some implementations, VoIP phone 2250 includes, in part, a microphone 2210, an audio output 2212 such as a speaker and/or audio output jack, a display monitor 2214, an input device 2216 such as a keypad, pointing device, voice actuation and/or other input devices, and a Wireless Fidelity (Wi-Fi) communication module 2208. Signal processing and/or control circuits 2204 and/or other circuits (not shown) in VoIP phone 2250 may process data, perform coding and/or encryption, perform calculations, format data and/or perform other VoIP phone functions.

VoIP phone 2250 may communicate with mass data storage 2202 that stores data in a nonvolatile manner such as optical and/or magnetic storage devices, for example hard disk drives HDD and/or DVDs. At least one HDD may have the configuration shown in FIG. 21A and/or at least one DVD may have the configuration shown in FIG. 21B. The HDD may be a mini HDD that includes one or more platters having a diameter that is smaller than approximately 1.8". VoIP phone 2250 may be connected to memory 2206, which may be a RAM, ROM, low latency nonvolatile memory such as flash memory and/or other suitable electronic data storage. VoIP phone 2250 is configured to establish communications link with a VoIP network (not shown) via Wi-Fi communication module 2208.

The invention has been described above with respect to particular illustrative embodiments. It is understood that the invention is not limited to the above-described embodiments and that various changes and modifications may be made by those skilled in the relevant art without departing from the spirit and scope of the invention.

For example, the SNR values of the bits in a particular SNR section of a channel need not be exactly the same or even substantially similar. Rather, the SNR values of the bits of an SNR section could lie within a continuous range of values unique to the section. For example, SNR sections could be defined based on "high", "middle", and "low" ranges of SNR.

In addition, the example embodiments describe channels in which each SNR section is continuous, e.g., a continuous area of storage bits having like SNR values or a continuous range of transmitted bits of a data signal having like SNR values. However, in general, SNR sections of a memory can be fragmented over the volume of the memory, i.e., composed of non-contiguous storage bits. Likewise, SNR sections of a data signal can be fragmented over the transmission period of the signal. In other words, the SNR profile of a memory or signal need not characterize continuous SNR sections.

What is claimed is:
1. A method of generating code words for error correction coding of a channel having a non-uniform signal-to-noise ratio (SNR), the method comprising:
    accessing a channel SNR profile, wherein the channel SNR profile characterizes sections of the channel having like SNR values;

partitioning each section of the channel into a number of partitions, wherein the number of partitions of each section equals a number of code words for the channel; and generating the code words by interleaving the partitions from each section, such that an average SNR of each code word is made the same or substantially the same as an average SNR of the channel.

2. The method of claim 1, further comprising:
determining the channel SNR profile.

3. The method of claim 1, wherein the error correction coding is an irregular code, in which code words comprise bits with different levels of protection, and the method further comprises:

interleaving the bits of the irregular code based on a code word SNR profile, the code word SNR profile characterizing partitions of each code word.

4. The method of claim 3, wherein interleaving the bits of the irregular code comprises:

interleaving a bit having a highest level of protection to correspond to a partition of a code word with a lowest SNR value; and iteratively interleaving the remaining bits, such that a bit having a highest level of protection of the remaining bits is interleaved to correspond to a partition of the code word with a lowest SNR value of the remaining available partitions.

5. The method of claim 1, wherein the channel is a volume holographic memory.

6. A method of generating a plurality of sets of code words for error correction coding (ECC) of a channel having a non-uniform signal-to-noise ratio (SNR), the sets corresponding to ECC codes of different strengths, the method comprising:

accessing a channel SNR profile, wherein the channel SNR profile characterizes sections of the channel having like SNR values;

partitioning each section of the channel into partitions; and generating the code words by interleaving the partitions from each section, wherein the partitioning is based on the relative strengths of the ECC codes, such that error rates associated with the sets of code words are made the same or substantially the same.

7. A code word generator apparatus for generating code words for error correction coding of a channel having a non-uniform signal-to-noise ratio (SNR), the apparatus comprising:

an access unit that accesses a channel SNR profile, wherein the channel SNR profile characterizes sections of the channel having like SNR values;

a partitioning unit that partitions each section of the channel into a number of partitions, wherein the number of partitions of each section equals a number of code words for the channel; and a code generator that generates the code words by interleaving the partitions from each section, such that an average SNR of each code word is made the same or substantially the same as an average SNR of the channel.

8. The apparatus of claim 7, further comprising:
a profiling unit that determines the channel SNR profile.

9. The apparatus of claim 7, wherein the error correction coding is an irregular code, in which code words comprise bits with different levels of protection, and the apparatus further comprises:

an interleaving unit that interleaves the bits of the irregular code based on a code word SNR profile, the code word SNR profile characterizing partitions of the code word.

10. The apparatus of claim 9, wherein interleaving the bits of the irregular code by the interleaving unit comprises:

interleaving a bit having a highest level of protection to correspond to a partition of a code word with a lowest SNR value; and iteratively interleaving the remaining bits, such that a bit having a highest level of protection of the remaining bits is interleaved to correspond to a partition of the code word with a lowest SNR value of the remaining available partitions.

11. The apparatus of claim 7, wherein the channel is a volume holographic memory.

12. A code word generator apparatus of generating a plurality of sets of code words for error correction coding (ECC) of a channel having a non-uniform signal-to-noise ratio (SNR), the sets corresponding to ECC codes of different strengths, the apparatus comprising:

an accessing unit that accesses a channel SNR profile, the channel SNR profile characterizing sections of the channel having like SNR values;

a partitioning unit that partitions each section of the channel into partitions; and a code generator that generates the code words by interleaving the partitions from each section, wherein the partitioning is based on the relative strengths of the ECC codes, such that error rates associated with the sets of code words are made the same or substantially the same.

* * * * *